(12) United States Patent
Lin et al.

(10) Patent No.: US 12,127,412 B2
(45) Date of Patent: Oct. 22, 2024

(54) SEMICONDUCTOR MEMORY DEVICES WITH COMMON SOURCE LINES AND METHODS OF MANUFACTURING THE SAME

(71) Applicant: Taiwan Semiconductor Manufacturing Company, Ltd., Hsinchu (TW)

(72) Inventors: Meng-Han Lin, Hsinchu (TW); Chia-En Huang, Xinfeng Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 247 days.

(21) Appl. No.: 17/586,092

(22) Filed: Jan. 27, 2022

(65) Prior Publication Data
US 2023/0048842 A1 Feb. 16, 2023

Related U.S. Application Data

(60) Provisional application No. 63/233,078, filed on Aug. 13, 2021.

(51) Int. Cl.
*H10B 53/30* (2023.01)
*H10B 51/20* (2023.01)
*H10B 51/30* (2023.01)
*H10B 53/20* (2023.01)

(52) U.S. Cl.
CPC ............ *H10B 53/30* (2023.02); *H10B 51/20* (2023.02); *H10B 51/30* (2023.02); *H10B 53/20* (2023.02)

(58) Field of Classification Search
CPC ........ H10B 12/30; H10B 51/00; H10B 51/10; H10B 51/20; H10B 51/30; H10B 53/00; H10B 53/10; H10B 53/20; H10B 53/30
See application file for complete search history.

(56) References Cited

U.S. PATENT DOCUMENTS

| 11,329,046 | B2 * | 5/2022 | Choi ...................... H10B 12/50 |
| 2019/0006376 | A1 * | 1/2019 | Ramaswamy ......... H10B 12/30 |
| 2022/0231026 | A1 * | 7/2022 | Wu ........................ H10B 99/00 |
| 2022/0352167 | A1 * | 11/2022 | Ramaswamy ......... H10B 12/37 |
| 2023/0337435 | A1 * | 10/2023 | Gardner ............ H01L 29/42392 |

FOREIGN PATENT DOCUMENTS

EP 3944327 A1 * 1/2022 ......... H01L 27/2436

* cited by examiner

*Primary Examiner* — Matthew E Warren
(74) *Attorney, Agent, or Firm* — FOLEY & LARDNER LLP

(57) ABSTRACT

A semiconductor device includes a first concentric structure extending along a vertical direction and wrapping around a first conductor structure. The semiconductor device includes a second concentric structure extending along the vertical direction and wrapping around a second conductor structure. The semiconductor device includes a third conductor structure extending along the vertical direction, wherein the third conductor structure is interposed between and spaced from the first and second concentric structures along a first lateral direction. The semiconductor device includes a fourth conductor structure extending along the first lateral direction. The fourth conductor structure at least partially wraps around each of the first concentric structure, the third conductor structure, and the second concentric structure.

20 Claims, 21 Drawing Sheets

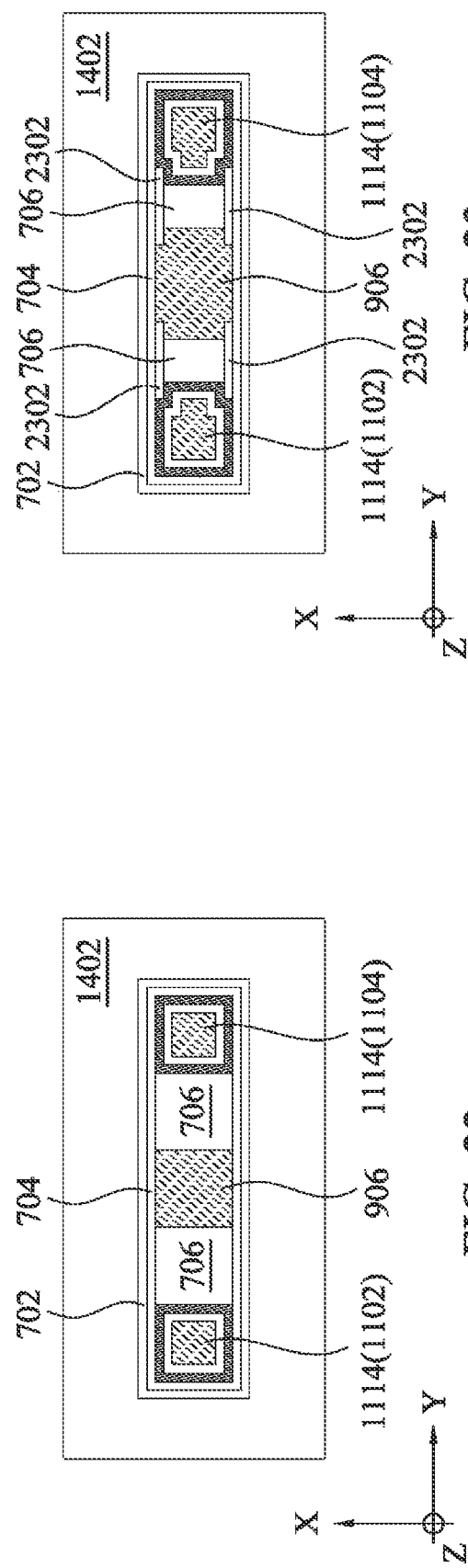
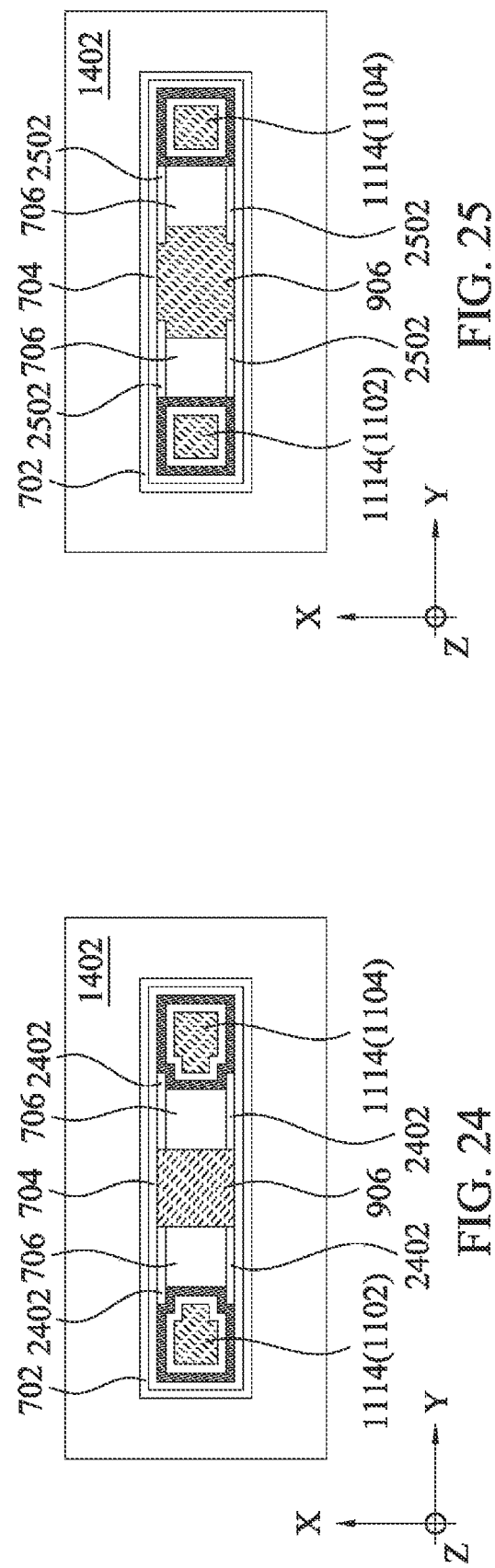
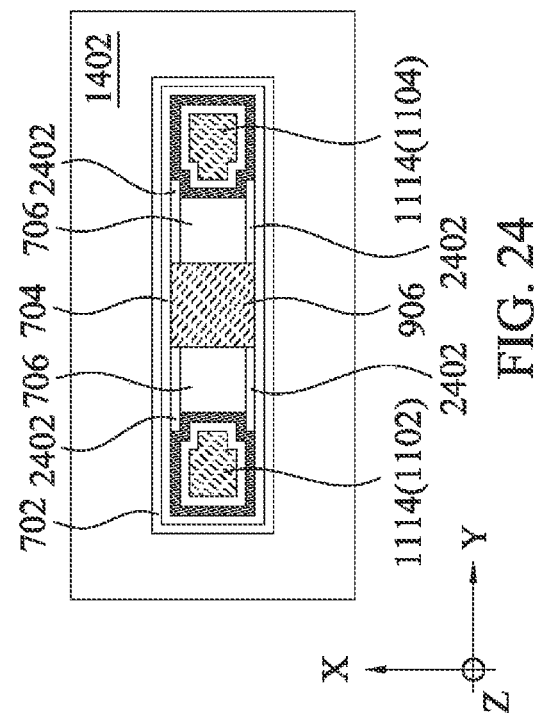

SEMICONDUCTOR MEMORY DEVICES WITH COMMON SOURCE LINES AND METHODS OF MANUFACTURING THE SAME

CROSS-REFERENCE TO RELATED APPLICATION

This application claims priority to and the benefit of U.S. Provisional Application No. 63/233,078, filed Aug. 13, 2021, entitled "COMMON SOURCE 3D FTJ MEMORY," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 22, 23, 24, and 25 illustrate various cross-sectional views of a portion of the example 3D memory device shown in FIGS. 5 to 16, in accordance with some embodiments.

DETAILED DESCRIPTION

Figure 1:
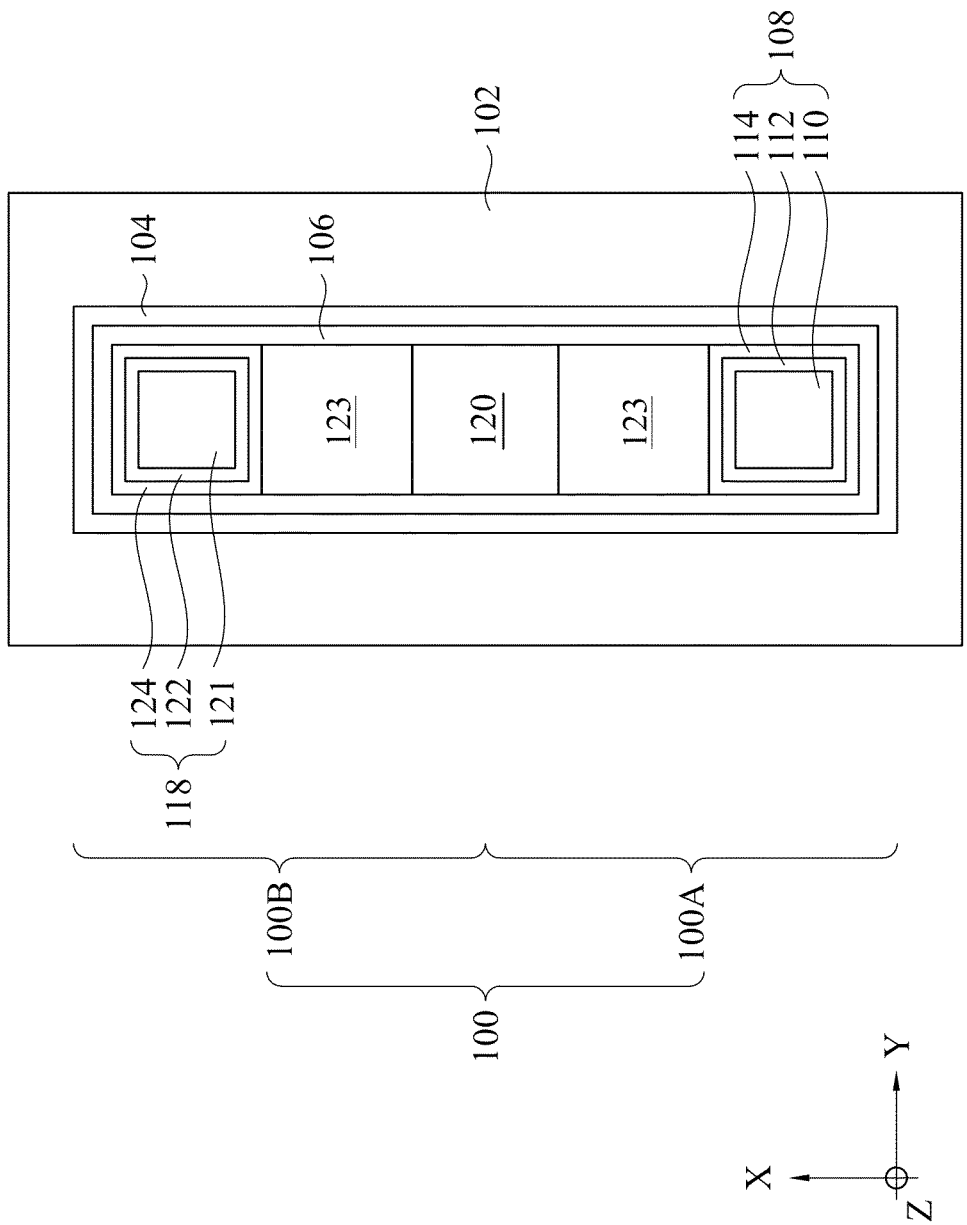
FIG. 1 illustrates a perspective view of a portion of a 3D memory device (e.g., a pair of memory strings), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization (which is the magnitude of polarization when no electrical field is applied) and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material may be detected by the electric field generated by the dipole moment of the ferroelectric material.

Embodiments of the present disclosure are discussed in the context of forming a semiconductor device, and particularly in the context of forming a three-dimensional (3D) memory device. The 3D memory device, as disclosed herein, includes a number of memory strings laterally spaced with respect to each other to form a memory array. Each of the memory strings includes a number of memory cells (e.g., random access memory cells) disposed in different memory levels, respectively. In various embodiments, each of the random access memory cells is configured as a 1-transistor-1-capacitor (1T1C) structure that includes a respective transistor and a respective ferroelectric memory component that functions as a capacitor. By arranging those memory cells in such 3D fashion, in addition to inheriting various advantages of the ferroelectric memory devices (e.g., a large on/off ratio, low operation voltage, nonvolatile characteristic, etc.), it allows a large number of ferroelectric memory devices (or cells) to be integrated within a given area, which further makes the disclosed 3D memory device an ideal candidate for a wide spectrum of applications such as, for example, artificial intelligence (AI) computing.

For example, the memory strings can be grouped into a plurality of pairs. Each memory string pair can be constituted by a number of first conductor structures extending along a lateral direction, a gate dielectric layer extending along a vertical direction across the first conductor structures, and a semiconductor layer extending along the vertical direction across the first conductor structures. In various embodiments, the gate dielectric layer and the semiconductor layer are each formed as a close-end conformal layer (e.g., when viewed from the top). For example, the gate dielectric layer surrounds an outer circumference (or sidewall) of the semiconductor layer. And, an inner circumference (or sidewall) of the semiconductor layer surrounds a second conductor structure extending along the vertical direction, a first metal-ferroelectric-metal (MFM) concentric (or coaxial) structure extending along the vertical direction and a second MFM concentric (or coaxial) structure. Specifically, the first conductor structures can function as word lines of the memory cells of the pair of memory strings, respectively. A third conductor structure wrapped within the first MFM concentric structure can function as a bit line of the memory cells of one of the pair of memory strings, and a fourth conductor structure wrapped within the second MFM concentric structure can function as a bit line of the memory cells of the other of the pair of memory strings, while the second conductor structure can function as a common source line of the memory cells of the pair of the memory strings.

FIG. 1 illustrates a cross-sectional view of an example pair of memory strings 100, as disclosed herein, in accordance with various embodiments of the present disclosure. The cross-sectional view of FIG. 1 shows one of a plurality of memory levels (or tiers) of the memory string pair 100, i.e., one memory cell of each of the memory string pair 100. As shown, the memory string pair 100, at this memory level, include one of the memory cells of a first memory string, hereinafter memory cell 100A, and one of the memory cells of a second memory string, hereinafter memory cell 100B.

The first memory cell 100A can be defined by (a first portion) of a first conductor structure 102, (a first portion) of a dielectric layer 104, (a first portion of) a semiconductor layer 106, a first concentric structure 108, and a common conductor structure 120; and the second memory cell 100B can be defined by (a second portion) of the first conductor structure 102, (a second portion) of the dielectric layer 104, (a second portion of) the semiconductor layer 106, a second concentric structure 118, and the common conductor structure 120. The first conductor structure 102 may continuously extend along a lateral direction (e.g., the X direction), and each of the dielectric layer 104, semiconductor layer 106, first and second concentric structures 108 and 118, and common conductor structure 120 may continuously extend along a vertical direction (e.g., the Z direction). The dielectric layer 104 and semiconductor layer 106 may each be formed as a close-end layer, with the dielectric layer 104 surrounding the semiconductor layer 106 which further surrounds the first and second concentric structures 108 and 118 and common conductor structure 120. The first and second concentric structures 108 and 118, and the common conductor structure 120 may be separated from one another (e.g., along the X direction) with a number of insulating layers 123 that also continuously extend along the vertical direction.

Each of the first and second concentric structures 108 and 118 includes an inner conductor (e.g., metal) structure, a ferroelectric structure (or layer) wrapping around the inner metal structure, and an outer conductor (e.g., metal) structure wrapping around the ferroelectric structure, which is sometimes referred to as a metal-ferroelectric-metal (MFM) structure. For example in FIG. 1, the first concentric structure 108 includes an inner metal structure 110, a ferroelectric structure 112 wrapping around the inner metal structure 110, and an outer metal structure 114 further wrapping around the ferroelectric structure 112; and the second concentric structure 118 includes an inner metal structure 121, a ferroelectric structure 122 wrapping around the inner metal structure 121, and an outer metal structure 124 further wrapping around the ferroelectric structure 122.

In various embodiments, the first conductor structure 102 can function as a common word line (WL) for the memory cells 100A and 100B, each of which includes one transistor and one capacitor coupled in series. Such a configuration of a memory cell including serially coupled transistor and capacitor is sometimes referred to as a one-transistor-one-capacitor (1T1C) configuration. Generally, the transistor may function as a switch for the 1T1C memory cell. For example, when the transistor is turned on (or otherwise activated), a conduction path can be formed through the transistor, which allows the capacitor to be accessed (e.g., read, programmed).

The transistor of the memory cell 100A may be defined by the respective first portions of the WL 102, the dielectric layer 104, and the semiconductor layer 106, with both ends (or terminals) of the transistor coupled to the first concentric structure 108 and the common conductor structure 120; and the transistor of the memory cell 100B may be defined by the respective second portions of the WL 102, the dielectric layer 104, and the semiconductor layer 106, with both ends (or terminals) of the transistor coupled to the second concentric structure 118 and the common conductor structure 120. Such a WL 102 can control (e.g., gate) the transistors of these two memory cells 100A and 100B. Further, the common conductor structure 120 can function as a common source line (SL) for these two memory cells, with the conductor structure 110 (wrapped within the concentric structure 108) and conductor structure 120 (wrapped within the concentric structure 118) functioning as bit lines (BLs) of these two memory cells, respectively. The concentric structure 108 can function as the capacitor of the memory cell 100A, and the concentric structure 118 can function as the capacitor of the memory cell 100B.

Figure 2:
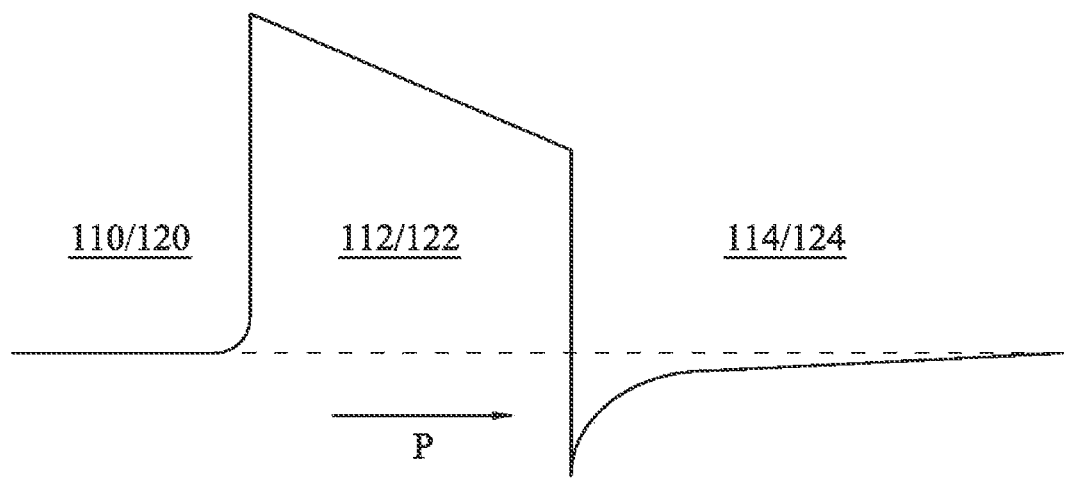
FIGS. 2 and 3 illustrate how band profiles (or diagrams) change when operating a capacitor of each memory cell of the memory string of FIG. 1, in accordance with some embodiments.
Figure 3:
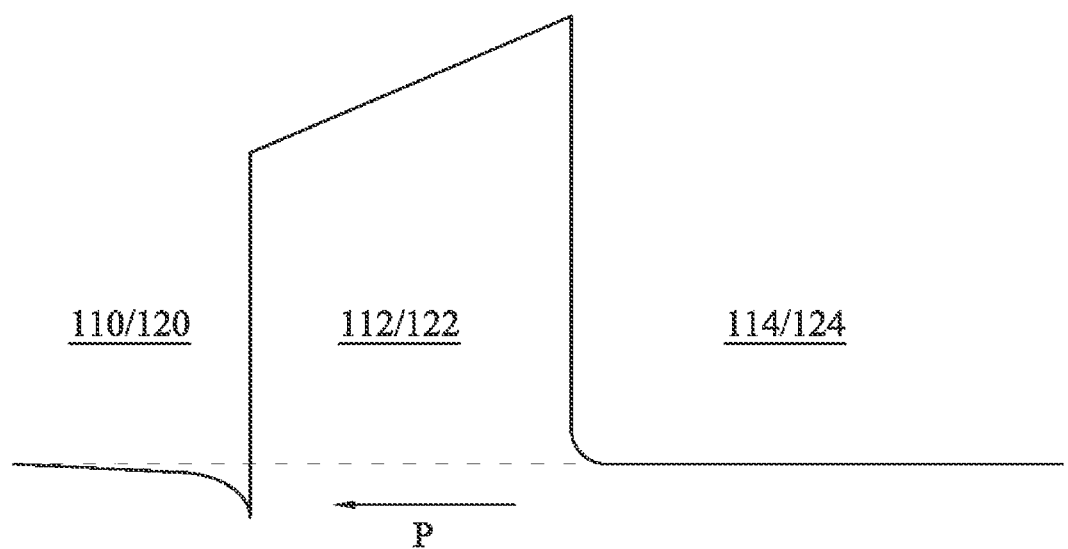

Referring to FIGS. 2 and 3, electrostatic potential energy band profiles are illustrated for an MFM structure (e.g., the concentric structures 108 and 118). Specifically, two different polarization directions within the ferroelectric structure 112/122 are shown. The magnitude and lateral extent of the distortion in the conduction band due to a dipole moment P in the ferroelectric structure 112/122 can be asymmetric. The asymmetric band modulations induced in the ferroelectric structure 112/122 can change a tunneling electrical resistance of the MFM structure 108/118, depending on the direction of the dipole moment P in the ferroelectric structure 112/122.

For example, polarization reversal of an MFM structure 108/118 can modulate a tunnel transmission coefficient induced by two different average barrier heights. Thus, electrostatic potential energy band profiles for the two different polarization states of the ferroelectric structure 112/122 provide two different electrical resistance states, which can be employed to program and store a data bit. The ratio of the conductance in a low electrical resistance state (e.g., FIG. 2) to the conductance in the high resistance state (e.g., FIG. 3) can be in a range from about 10 to about 1,000, such as from about 30 to about 300, although lesser and greater ratios may also be employed. The polarization state of the ferroelectric structure exhibits a hysteresis curve as a function of an external voltage bias across the sandwiching metal structures (e.g., 110 and 114, 120 and 124), and is capable of storing a data bit. The programmable resistance states of an MFM structure is used in various ferroelectric memory devices of the embodiments of the present disclosure.

Figure 4:
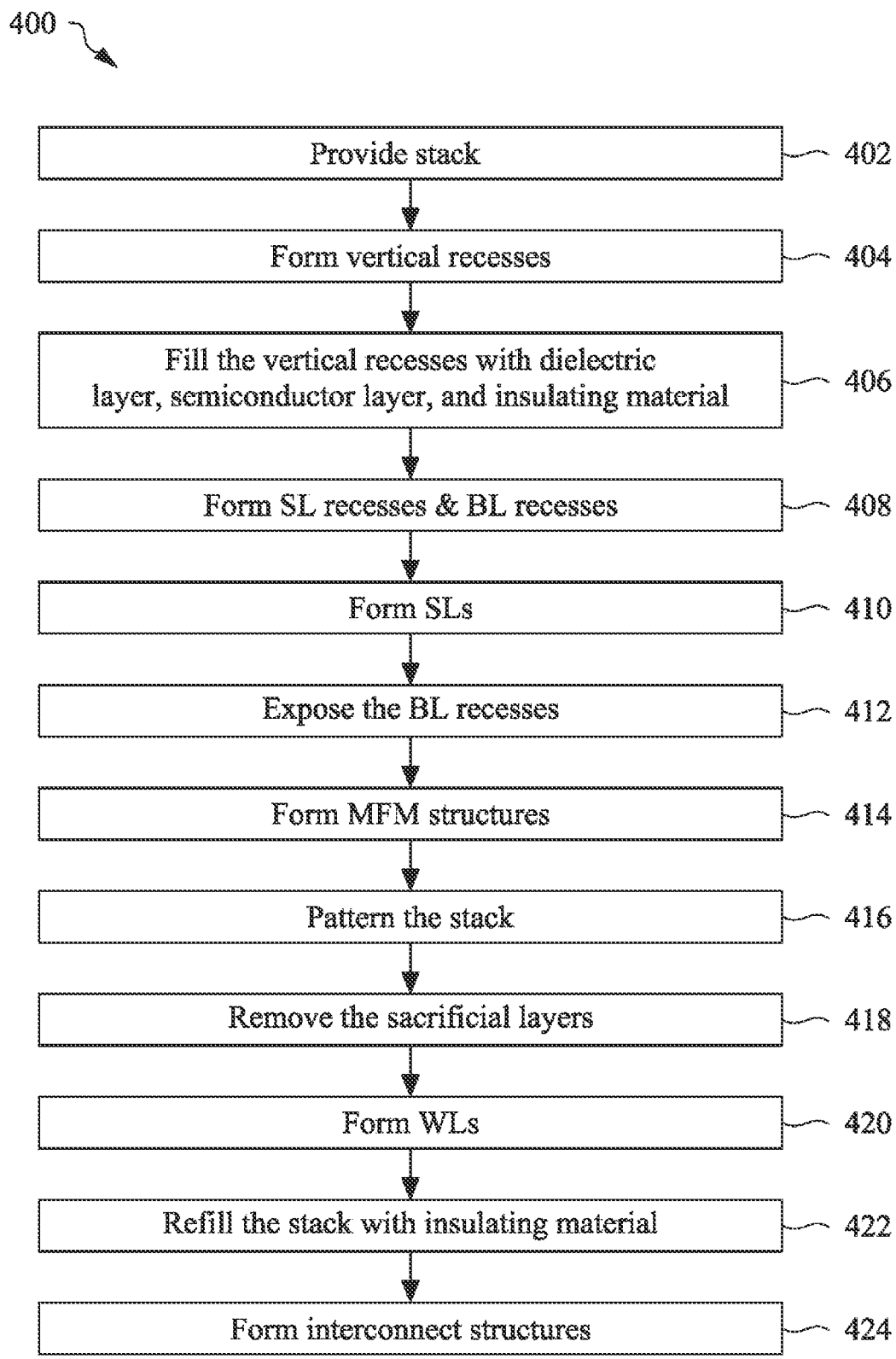
FIG. 4 is an example flow chart of a method for fabricating a 3D memory device, in accordance with some embodiments.

FIG. 4 illustrates a flowchart of a method 400 to form a memory device, according to one or more embodiments of the present disclosure. For example, at least some of the operations (or steps) of the method 400 can be performed to fabricate, make, or otherwise form a three-dimensional (3D) memory device having a number of memory string pairs (e.g., the memory string pair 100 of FIG. 1). Each memory string of the pair has a number of ferroelectric memory cells (e.g., the memory cells 100A and 100B of FIG. 1) vertically arranged with respect to one another. Further, a number of such memory strings, laterally arranged with respect to one another, can form a 3D memory array.

It is noted that the method 400 is merely an example, and is not intended to limit the present disclosure. Accordingly, it should be understood that additional operations may be provided before, during, and after the method 400 of FIG. 4, and that some other operations may only be briefly described herein. In some embodiments, operations of the method 400 may be associated with perspective views of an example 3D memory device 500 at various fabrication stages as shown in FIGS. 5, 6, 7, 8, 9, 10, 11, 12, 13, 14, 15, and 16, respectively, which will be discussed in further detail below.

In brief overview, the method 400 starts with operation 402 of providing a stack of insulating layers and sacrificial layers over a substrate. The method 400 continues to operation 404 of forming a number of vertical recesses. The method 400 continues to operation 406 of filling each of the vertical recesses with a dielectric layer, a semiconductor layer, and an insulating material. The method 400 continues to operation 408 of forming a number of SL recess and a number of BL recesses. The method 400 continues to operation 410 of forming a number of SLs. The method 400 continues to operation 412 of again exposing the number of BL recesses. The method 400 continues to operation 414 of forming a number of MFM structures. The method 400 continues to operation 416 of patterning the stack. The method 400 continues to operation 418 of removing the sacrificial layers. The method 400 continues to operation 420 of forming a number of WLs. The method 400 continues to operation 422 of refilling the stack with an insulating material. The method 400 continues to operation 424 of forming a number of interconnect structures.

Figure 5:
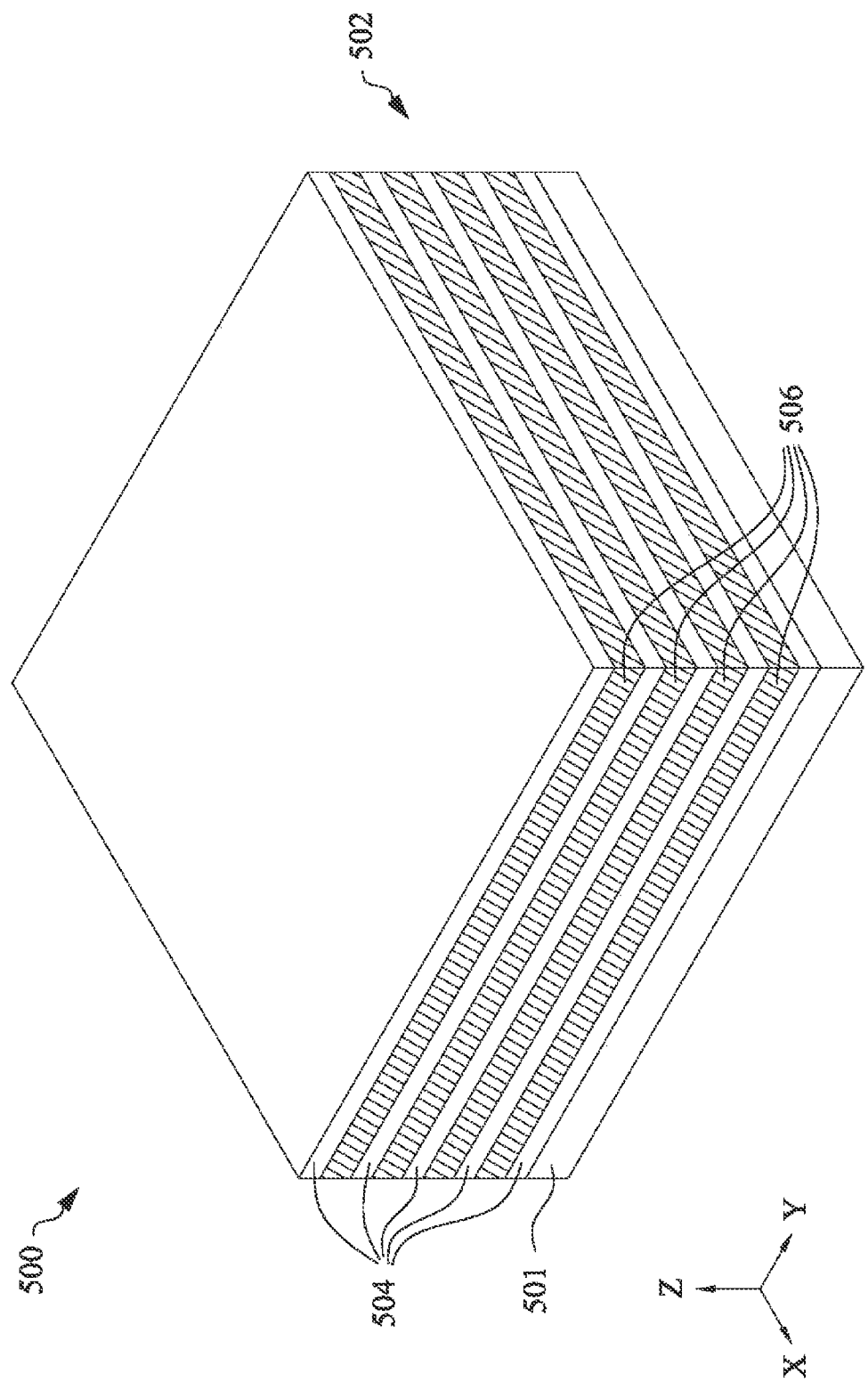
FIGS. 5, 6, 7, 8, 9, 10, 11, 12, 13, 14, 15, and 16 illustrate perspective views of an example 3D memory device (or a portion of the example 3D memory device) during various fabrication stages, made by the method of FIG. 4, in accordance with some embodiments.

Corresponding to operation 402 of FIG. 4, FIG. 5 illustrates a perspective view of the 3D memory device 500 including a stack 502 formed over a substrate 501 at one of the various stages of fabrication, in accordance with various embodiments.

The substrate 501 may be a semiconductor substrate, such as a bulk semiconductor, a semiconductor-on-insulator (SOI) substrate, or the like, which may be doped (e.g., with a p-type or an n-type dopant) or undoped. The substrate 501 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 501 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other materials are within the scope of the present disclosure. For example, the substrate 501 may include an insulating material (e.g., silicon nitride (SiN)) that function as an etch stop layer disposed over a semiconductor substrate.

The stack 502 includes a number of insulating layers 504 and a number of sacrificial layers 506 alternately stacked on top of one another over the substrate 501 along a vertical direction (e.g., the Z direction). Although five insulating layers 504 and four sacrificial layers 506 are shown in the illustrated embodiments of FIG. 5, it should be understood that the stack 502 can include any number of insulating layers and any number of sacrificial layers alternately disposed on top of one another, while remaining within the scope of the present disclosure.

Further, although the stack 502 directly contacts the substrate 501 in the illustrated embodiment of FIG. 5 (and the following figures), it should be understood that the stack 502 may be separated from a top surface of the substrate 501. For example, a number of (planar and/or non-planar) transistors may be formed over the substrate 501, and a number of metallization layers, each of which includes a number of contacts electrically connecting to those transistors, may be formed between the substrate 501 and the stack 502. As used herein, the alternately stacked insulating layers 504 and sacrificial layers 506 may refer to each of the sacrificial layers 506 being adjoined by two adjacent insulating layers 504. The insulating layers 504 may have the same thickness thereamongst, or may have different thicknesses. The sacrificial layers 506 may have the same thickness thereamongst, or may have different thicknesses. The stack 502 may begin with the insulating layer 504 (as shown in FIG. 5) or the sacrificial layer 506 (in some other embodiments).

The insulating layers 504 can include at least one insulating material. The insulating materials that can be employed for the insulating layer 504 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. Other insulating materials are within the scope of the present disclosure. In one embodiment, the insulating layers 304 include silicon oxide.

The sacrificial layers 506 may include an insulating material, a semiconductor material, or a conductive material. The material of the sacrificial layers 506 is a sacrificial material that can be subsequently removed selective to the material of the insulating layers 504. In accordance with various embodiments, each sacrificial layer 506, sandwiched by a respective pair of insulating layers 504, may correspond to a memory level, in which a number of memory cells that are laterally disposed from one another can be formed. Non-limiting examples of the sacrificial layers 506 include silicon nitride, an amorphous semiconductor material (such as amorphous silicon), and a polycrystalline semiconductor material (such as polysilicon). In one embodiment, the sacrificial layers 506 can be spacer material layers that include silicon nitride or a semiconductor material including at least one of silicon or germanium. Other materials are within the scope of the present disclosure.

The stack 502 can be formed by alternately depositing the respective materials of the insulating layers 504 and sacrificial layers 506 over the substrate 501. In some embodiments, one of the insulating layers 504 can be deposited, for example, by chemical vapor deposition (CVD), followed by depositing such as, for example, using CVD or atomic layer deposition (ALD), one of the sacrificial layers 506. Other methods of forming the stack 502 are within the scope of the present disclosure.

Figure 6:
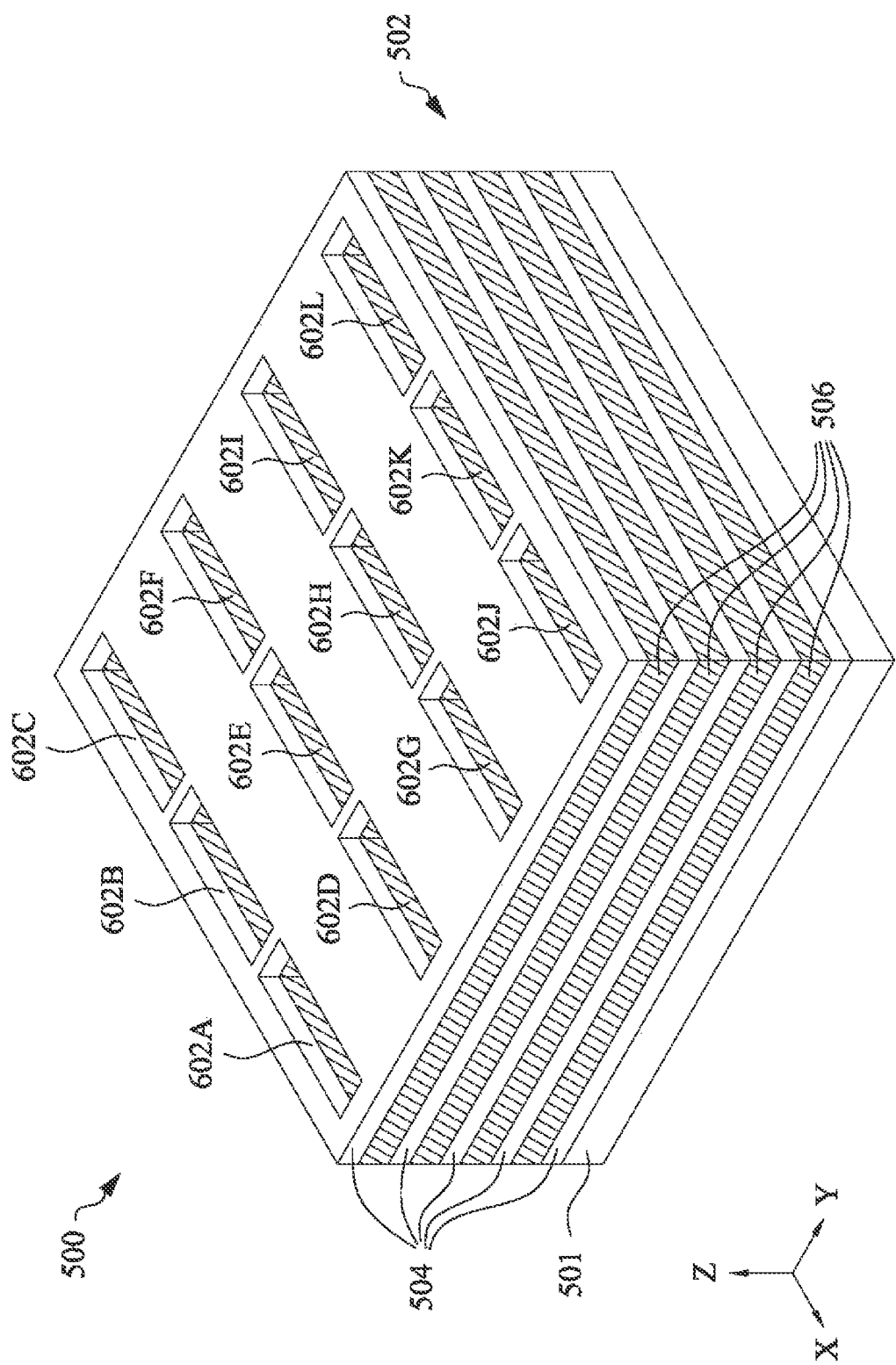

Corresponding to operation 404 of FIG. 4, FIG. 6 illustrates a perspective view of the 3D memory device 500 in which a number of vertical recesses, 602A, 602B, 602C, 602D, 602E, 602F, 602G, 602H, 602I, 602J, 602K, and 602L, are formed through the stack 502 at one of the various stages of fabrication, in accordance with various embodiments. Each of the vertical recessed 602A to 602L may be used to define a footprint of a pair of the disclosed memory strings, which will be discussed in further detail below.

The vertical recessed 602A to 602L can be spaced apart from one another and arranged in any of various configurations, in accordance with some embodiments of the present disclosure. For example in FIG. 6, a subset of the vertical recessed, e.g., 602A to 602C, 602D to 602F, 602G to 602I, and 602J to 602L, are aligned with each other along a first lateral direction (the X direction), and corresponding ones of each of such subsets, e.g., 602A, 602D, 602G, and 602J, are aligned with each other along a second lateral direction (the Y direction). Alternative stated, the vertical recessed 602A to 602L can form an array (e.g., a two-dimensional array) having a number of rows and a number of columns intersecting with one another. As will be discussed with respect to FIGS. 19 and 21 below, such footprints of memory string pairs can be arranged in other configuration, while remaining within the scope of the present disclosure. Further, each of the vertical recessed 602A to 602L is formed to have a lengthwise direction along the X direction, in the illustrated example of FIG. 6, which allows a number of conductor structures spaced apart in such a lengthwise direction. However, it should be understood that other lengthwise direction is possible.

The vertical recessed 602A to 602L can be formed by depositing a photoresist or other masking layer on a top surface of the stack 502, with a pattern corresponding to the vertical recesses 602 defined in the masking layer (e.g., via photolithography, e-beam lithography, or any other suitable lithographic process), followed an etching process. The etching process may include, for example, using a reactive ion etch (RIE) process, a neutral beam etch (NBE) process, the like, or combinations thereof to etch the insulating layers 504 and sacrificial layers 506 of the stack 502 until the substrate 501 is exposed. The etching process may be anisotropic. As such, each of the vertical recessed 602A to 602L can continuously extend through the stack 502, and thus, has inner sidewalls extending along a vertical direction (e.g., the Z direction).

Figure 7:
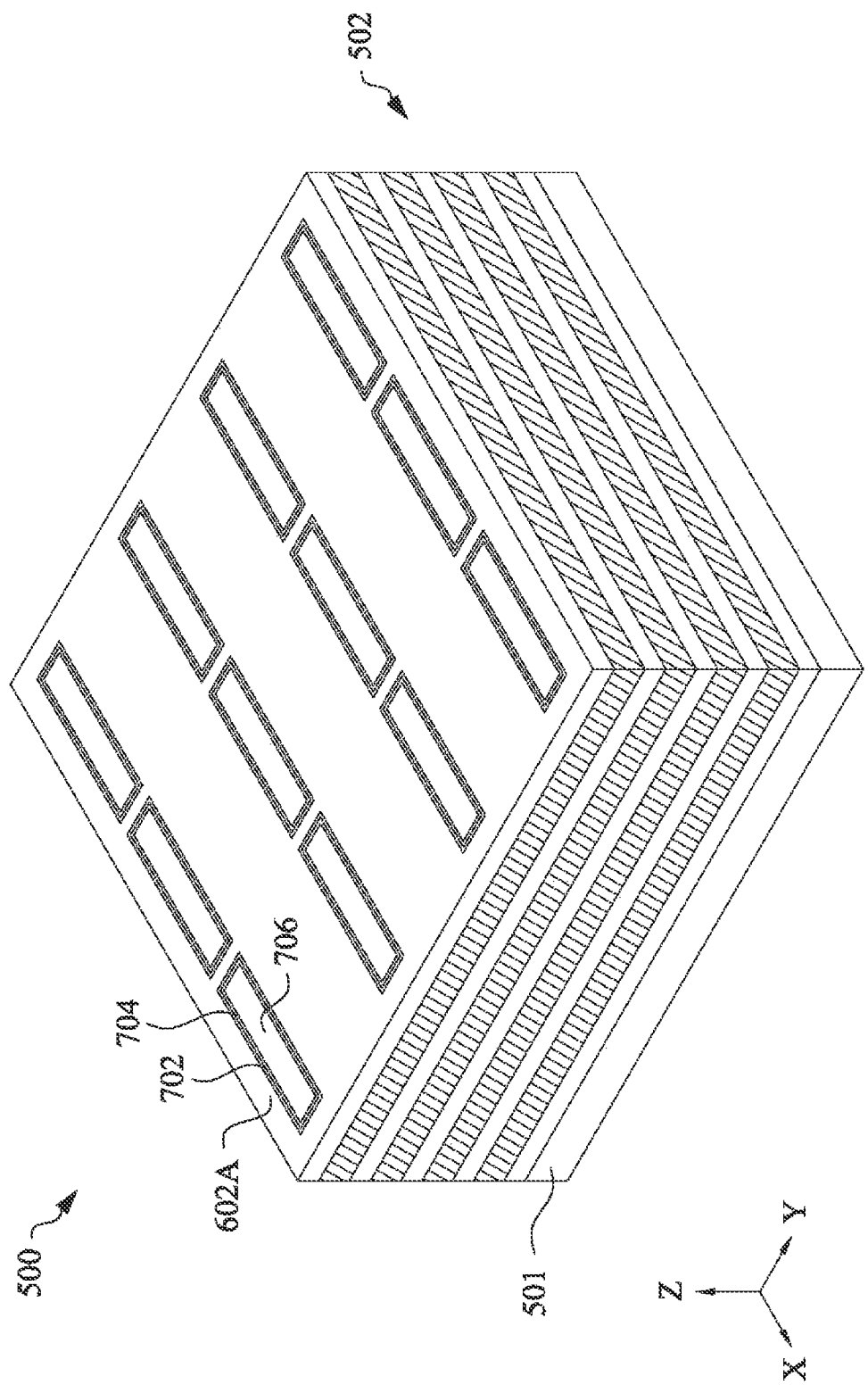

Corresponding to operation 406 of FIG. 4, FIG. 7 illustrates a perspective view of the 3D memory device 500 including a number of dielectric layers 702 and a number of semiconductor layers 704 formed within the vertical recesses 602A to 602L, respectively, at one of the various stages of fabrication, in accordance with various embodiments.

Each of the dielectric layers 702 is formed as a conformal layer lining inner sidewalls of a corresponding one of the vertical recesses 602A to 602L and a corresponding one of the semiconductor layers 704 is further formed along inner sidewalls of the dielectric layer, with a remaining portion of the vertical recesses filled with an insulating material 706. Using the vertical recess 602A as an example, the dielectric layer 702 lines the inner sidewall of the vertical recess 602A and the semiconductor layer 704 further lines inner sidewalls of the dielectric layer 702, with a remaining portion of the vertical recess 602A filled with the insulating material 706, as shown in FIG. 7.

The dielectric layers 702 and semiconductor layers 704 shown in FIG. 7 can be formed by performing at least some of the following processes: depositing a (e.g., conformal) dielectric material lining each of the vertical recesses 602A to 602L (FIG. 6); depositing a (e.g., conformal) semiconductor material over a corresponding one of the dielectric material; etching respective lateral portions of the dielectric material and semiconductor material disposed at a bottom of each vertical recesses 602A to 602L; and depositing a dielectric material to fill the remaining portion of each of the vertical recesses 602A to 602L. The deposited dielectric material (to form the insulating material 706) may be similar to the material of the insulating layers 504, in some embodiments.

The foregoing dielectric material, used to form the dielectric layers 702, may include a high-k dielectric material. Example high-k dielectric materials include a metal oxide or a silicate of Hf, Al, Zr, La, Mg, Ba, Ti, Pb, and combinations thereof. The dielectric material can be deposited (as a blanket layer) over the workpiece as a continuous liner structure, for example, by a conformal deposition method such as atomic layer deposition (ALD) or chemical vapor deposition (CVD). Other deposition methods are within the scope of the present disclosure.

The foregoing semiconductor material, used to form the semiconductor layers 704, may include a doped or undoped semiconductor material such as, for example, Si (e.g., polysilicon or amorphous silicon), Ge, SiGe, silicon carbide (SiC), indium gallium zinc oxide (IGZO), indium tin oxide (ITO), indium zinc oxide (IZO), indium tungsten oxide (IWO), or combinations thereof. The semiconductor material can be deposited (as a blanket layer) over the workpiece as a continuous liner structure, for example, by a conformal deposition method such as atomic layer deposition (ALD) or chemical vapor deposition (CVD). Other deposition methods are within the scope of the present disclosure.

Figure 8:
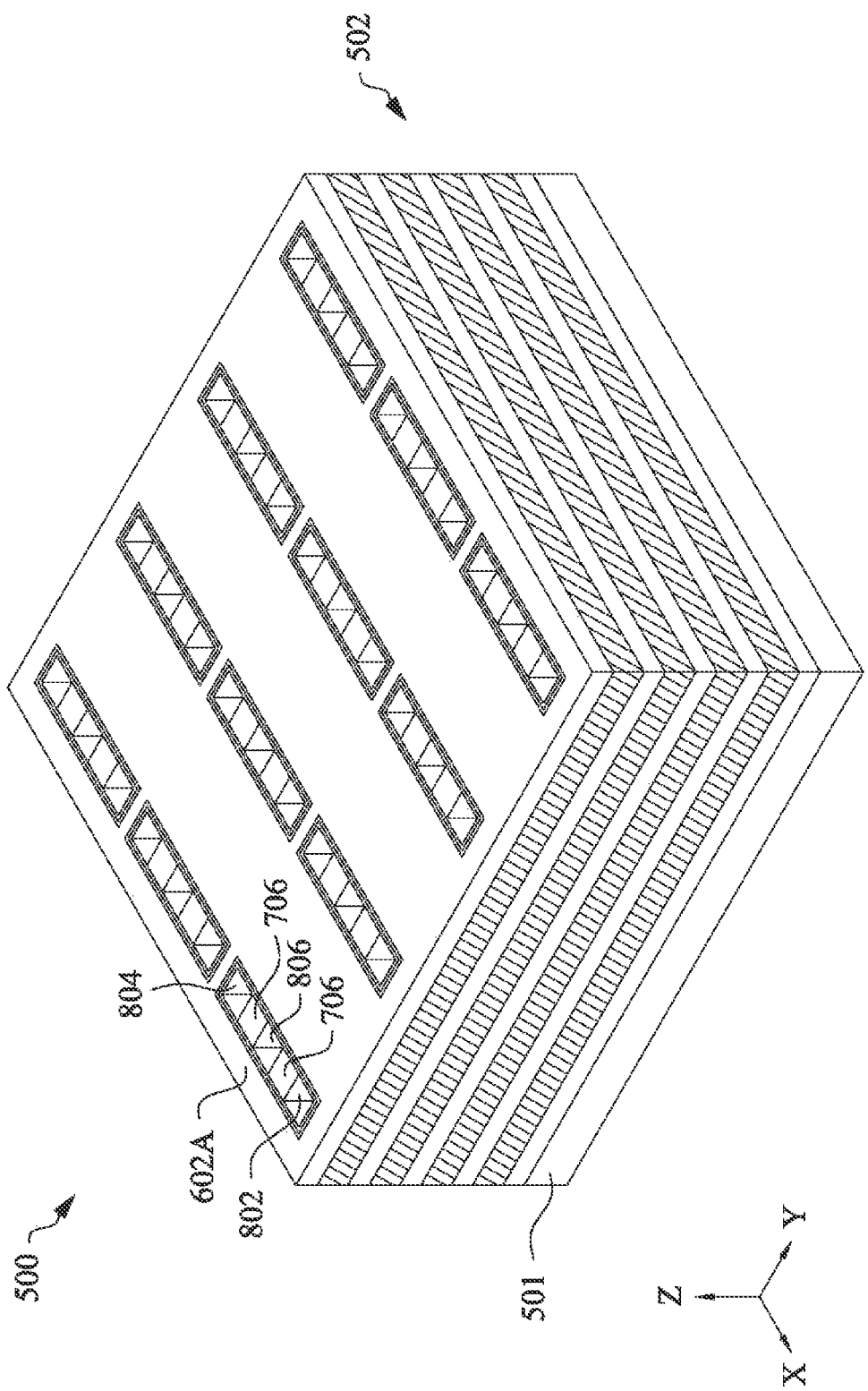

Corresponding to operation 408 of FIG. 4, FIG. 8 illustrates a perspective view of the 3D memory device 500 including a pair of BL recesses 802 and 804, and a SL recess 806 formed within each of the vertical recesses 602A to 602L at one of the various stages of fabrication, in accordance with various embodiments.

The pair of BL recesses 802 and 804 and the SL recess 806 are formed by patterning the insulating material 706 filling each of the vertical recesses 602A to 602L. The patterning process can include depositing a photoresist or other masking layer on a top surface of the stack 502, with a pattern corresponding to the BL recesses 802-804 and SL recess 806 defined in the masking layer (e.g., via photolithography, e-beam lithography, or any other suitable lithographic process), followed an etching process. The etching process may include, for example, using a reactive ion etch (RIE) process, a neutral beam etch (NBE) process, the like, or combinations thereof to etch the insulating material 706 until the substrate 501 is exposed. The etching process may be anisotropic. As such, each of the BL recesses 802-804 and SL recess 806 can continuously extend through the stack 502, and thus, has inner sidewalls extending along a vertical direction (e.g., the Z direction).

The BL recesses 802-804 and SL recess 806 are arranged along the lengthwise direction of a corresponding one of the vertical recesses 602A to 602L (e.g., the X direction), and are spaced apart (e.g., isolated) from one another with a remaining portion of the insulating material 706, according to various embodiments. Further, the SL recess 806 is disposed between the BL recesses 802 and 804 along such a lengthwise direction of the corresponding vertical recess. In some embodiments, the BL recesses 802 and 804 are respectively disposed at ends of the corresponding vertical recess, with the SL recess 806 disposed around a middle of the corresponding vertical recess, as shown in a representative example of the vertical recess 602A in FIG. 8.

Figure 9:
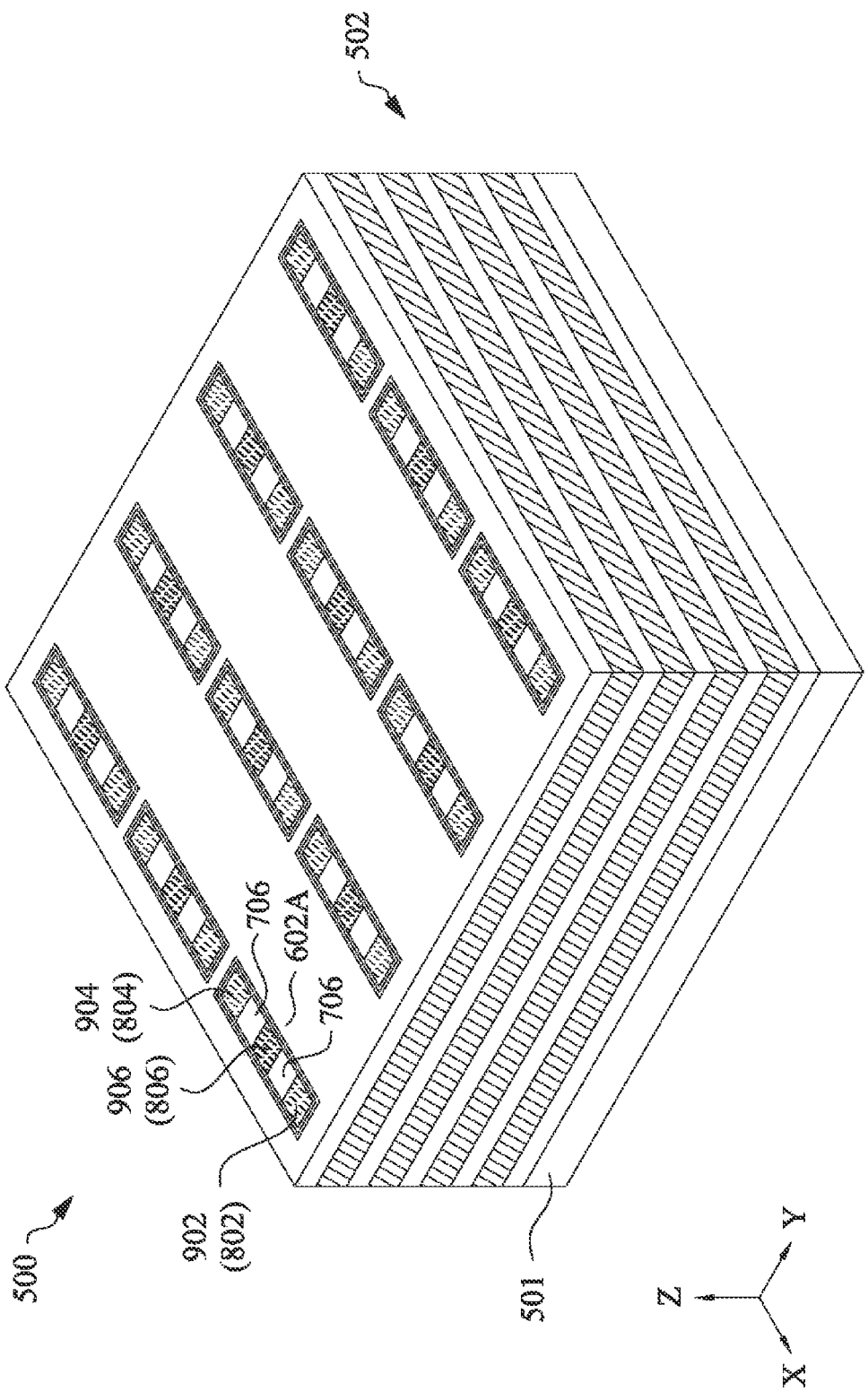

Corresponding to operation 410 of FIG. 4, FIG. 9 illustrates a perspective view of the 3D memory device 500 including a number of SLs 902, 904, and 906 at one of the various stages of fabrication, in accordance with various embodiments.

The SLs 902, 904, and 906 are formed by filling the BL recesses 802 and 804 and the SL recess 806, respectively, with a conductor material (e.g., metal), optionally followed by a polishing process. Example metal materials may be selected from the group including aluminum, tungsten, tungsten nitride, copper, cobalt, silver, gold, chrome, ruthenium, platinum, titanium, titanium nitride, tantalum, tantalum nitride, nickel, hafnium, and combinations thereof. As such, the SLs 902 to 906 can inherit the dimensions and profiles of the BL recesses 802 and 804 and the SL recess 806, respectively. For example in FIG. 9, the SLs 902 and 904 are disposed at ends of the corresponding vertical recess (e.g., 602A), with the SL 906 disposed around a middle of the corresponding vertical recess. In some embodiments, the end-positioned SLs (e.g., 902 and 904) will be removed and replaced with a pair of MFM structures, respectively, which will be discussed as follows.

Figure 10:
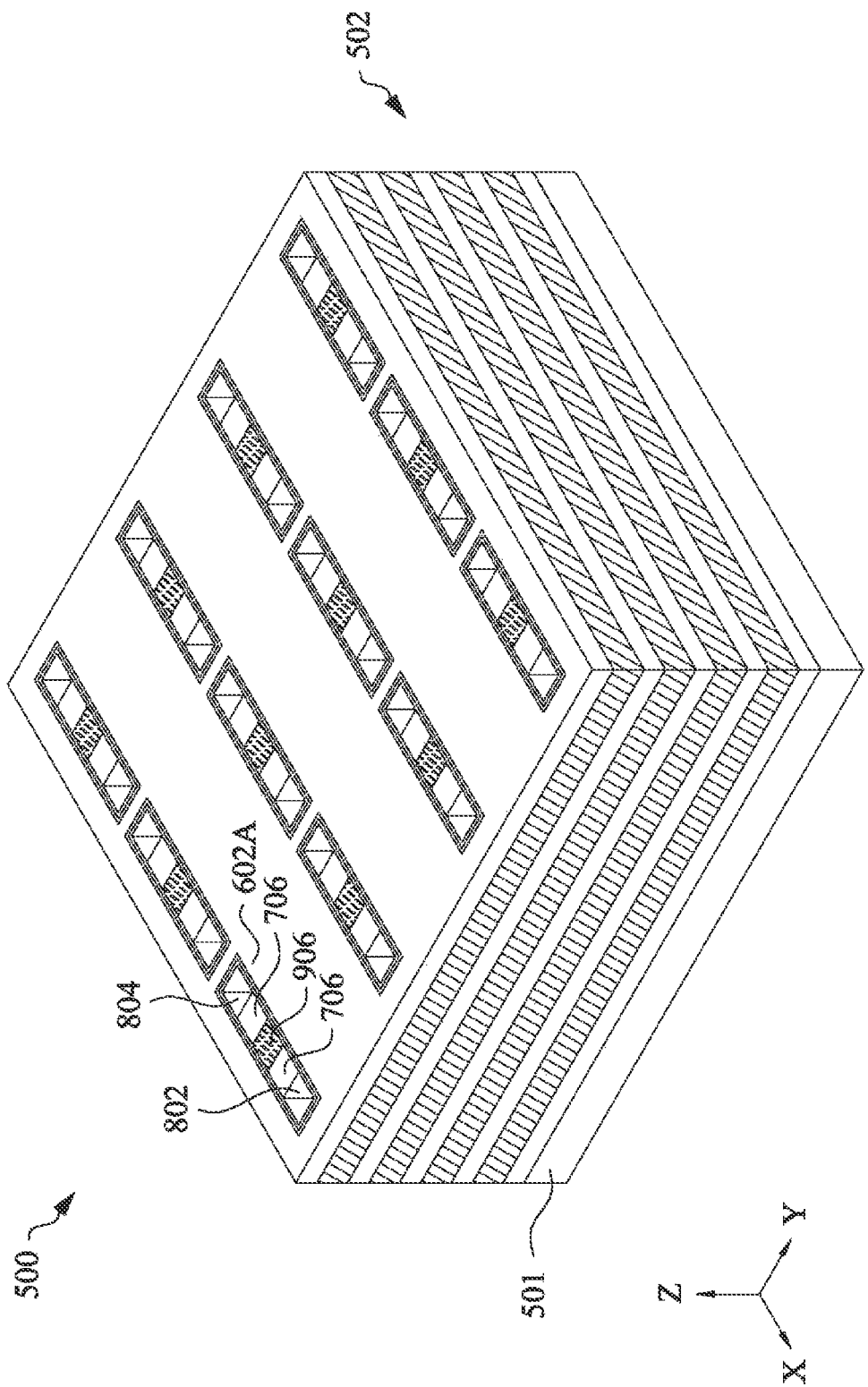

Corresponding to operation 412 of FIG. 4, FIG. 10 illustrates a perspective view of the 3D memory device 500 in which the pair of BL recesses 802 and 804 within each of the vertical recess 602A to 602L are again exposed at one of the various stages of fabrication, in accordance with various embodiments.

Upon forming the SLs 902-906 (by filling the BL recesses 802-804 and SL recess 806), the end-positioned SLs 902 and 904 are selectively removed to again expose the BL recesses 802 and 804, respectively, in some embodiments. The re-exposure process can include depositing a photoresist or other masking layer on a top surface of the stack 502, with a pattern corresponding to the end-positioned SLs 902 and 904 defined in the masking layer (e.g., via photolithography, e-beam lithography, or any other suitable lithographic process), followed an etching process. The etching process may include, for example, using a reactive ion etch (RIE) process, a neutral beam etch (NBE) process, the like, or combinations thereof to etch the end-positioned SLs 902 and 904 until the substrate 501 is exposed. The etching process may be anisotropic.

Figure 11:
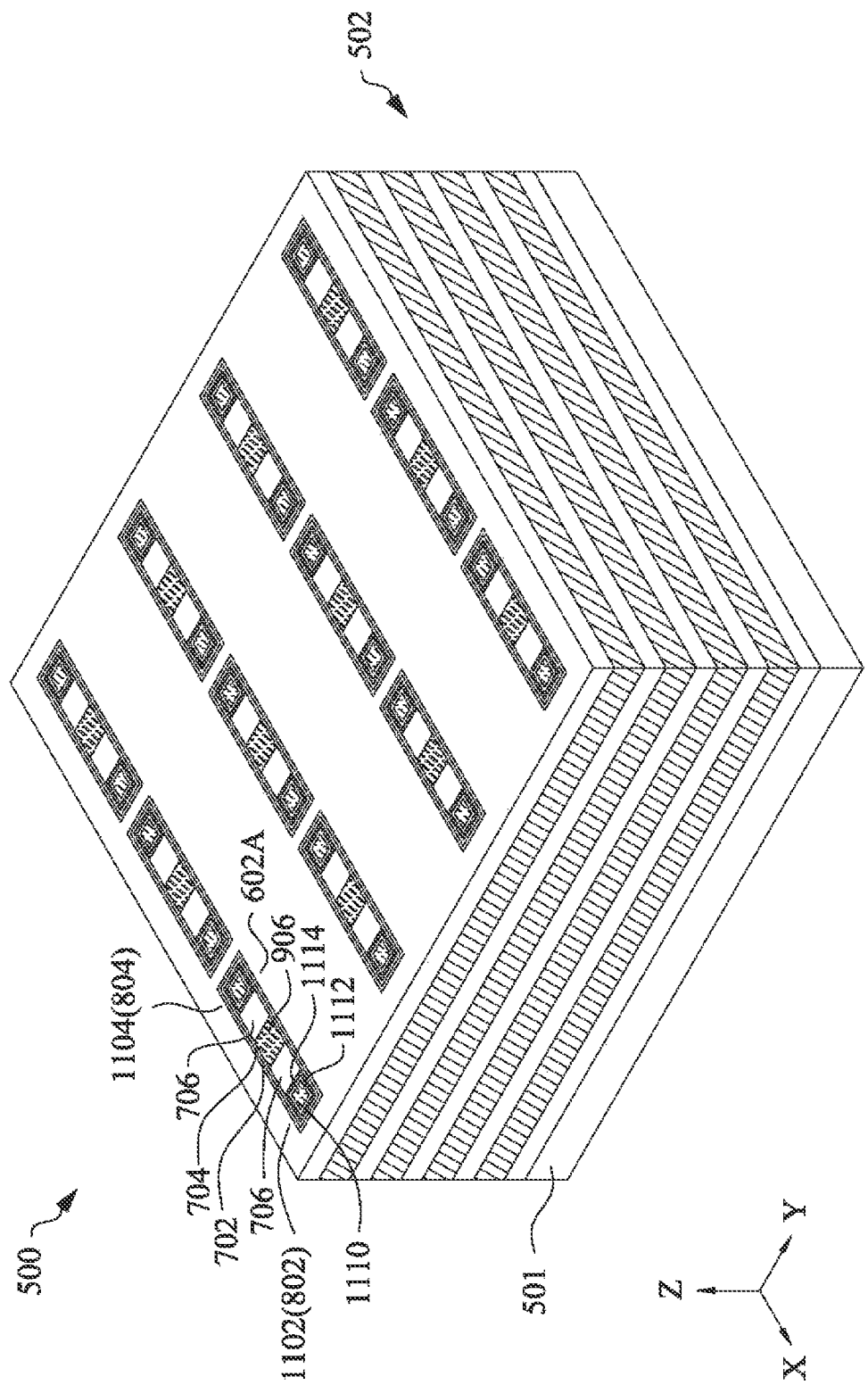

Corresponding to operation 414 of FIG. 4, FIG. 11 illustrates a perspective view of the 3D memory device 500 including a pair of metal-ferroelectric-metal (MFM) structures 1102 and 1104 within each of the vertical recesses 602A to 602L at one of the various stages of fabrication, in accordance with various embodiments.

The MFM structures 1102 and 1104 are formed within the re-exposed BL recesses 802 and 804, respectively. As such, the MFM structures 1102 and 1104 are disposed at ends of a corresponding one of the vertical recesses 602A to 602L along its lengthwise direction (e.g., the X direction). For example, the semiconductor layer 704 can partially wrap around each of the MFM structures 1102 and 1104, and the SL 906. As shown in FIG. 11, the semiconductor layer 704 can be coupled to (e.g., in contact with) three sidewalls of each of the MFM structures 1102 and 1104, and be coupled to (e.g., in contact with) two sidewalls of the SL 906. And, the dielectric layer 702 can further wrap around the semiconductor layer 704.

In various embodiments, each of the MFM structures 1102 and 1104 is formed as a concentric (or coaxial) structure that includes an outer structure 1110, a middle structure 1112, and an inner structure 1114 sharing the same center. The outer structure 1110 wraps around the middle structure 1112, and the middle structure 1112 wraps around the inner structure 1114. In some embodiments, each of the inner structures 1114 can function as or be operatively (e.g., electrically) coupled to the BL of a corresponding memory string, which will be discussed in further detail below.

The outer structure 1110 and inner structure 1114 are formed of the same metal material or respectively different metal materials, and the middle structure 1112 is formed of a ferroelectric material. Example metal materials may be selected from the group including aluminum, tungsten, tungsten nitride, copper, cobalt, silver, gold, chrome, ruthenium, platinum, titanium, titanium nitride, tantalum, tantalum nitride, nickel, hafnium, and combinations thereof. The ferroelectric material includes, and/or consists essentially of, at least one ferroelectric material such as hafnium oxide (such as hafnium oxide containing at least one dopant selected from Al, Zr, and Si and having a ferroelectric non-centrosymmetric orthorhombic phase), zirconium oxide, hafnium-zirconium oxide, bismuth ferrite, barium titanate (such as $BaTiO_3$; BT), colemanite (such as $Ca_2B_6O_{11} \cdot 5H_2O$), bismuth titanate (such as $Bi_4Ti_3O_{12}$), europium barium titanate, ferroelectric polymer, germanium telluride, langbeinite (such as $M_2M'_2(SO_4)_3$ in which M is a monovalent metal and M' is a divalent metal), lead scandium tantalate (such as $Pb(Sc_xTa_{1-x})O_3$), lead titanate (such as $PbTiO_3$; PT), lead zirconate titanate (such as $Pb(Zr,Ti) O_3$; PZT), lithium niobate (such as $LiNbO_3$; LN), ($LaAlO_3$)), polyvinylidene fluoride ($CH_2CF_2)_n$, potassium niobate (such as $KNbO_3$), potassium sodium tartrate (such as $KNaC_4H_4O_6 \cdot 4H_2O$), potassium titanyl phosphate (such as $KO_5PTi$), sodium bismuth titanate (such as $Na_{0.5}Bi_{0.5}TiO_3$ or $Bi_{0.5}Na_{0.5}TiO_3$), lithium tantalate (such as $LiTaO_3$(LT)), lead lanthanum titanate (such as $(Pb,La)TiO_3$(PLT)), lead lanthanum zirconate titanate (such as $(Pb,La)(Zr,Ti)O_3$ (PLZT)), ammonium dihydrogen phosphate (such as $NH_4H_2PO_4$(ADP)), or potassium dihydrogen phosphate (such as $KH_2PO_4$(KDP)).

In various embodiments, the MFM structures 1102 and 1114 may be formed by performing at least some of the following processes: (e.g., conformally) depositing one of the foregoing metal materials in the re-exposed BL recesses 802 and 804 to form the outer structures 1110 by, for example, CVD, PVD, electroless plating, electroplating, or combinations thereof; (e.g., conformally) depositing one of the foregoing ferroelectric materials in the vertical recesses to form the middle structures 1112 by, for example, CVD, PVD, ALD, or combinations thereof; (e.g., conformally) depositing one of the foregoing metal materials in the vertical recesses to form the inner structures 1114 by, for example, CVD, PVD, electroless plating, electroplating, or combinations thereof; and polishing the workpiece.

In one of the various embodiments, the respective metal materials of the SLs 906 and the inner structures 1114 of the MFM structures may be the same, but different from the metal material of the outer structures 1110 of the MFM structures. In another of the various embodiments, the respective metal materials of the SLs 906, the inner structures 1114 of the MFM structures, and the outer structures 1110 of the MFM structures may be the same. In yet another of the various embodiments, the respective metal materials of the SLs 906 and the outer structures 1110 of the MFM structures may be the same, but different from the metal material of the inner structures 1114 of the MFM structures. In yet another of the various embodiments, the respective metal materials of the SLs 906, the inner structures 1114 of the MFM structures, and the outer structures 1110 of the MFM structures may be different from one another.

Figure 12:
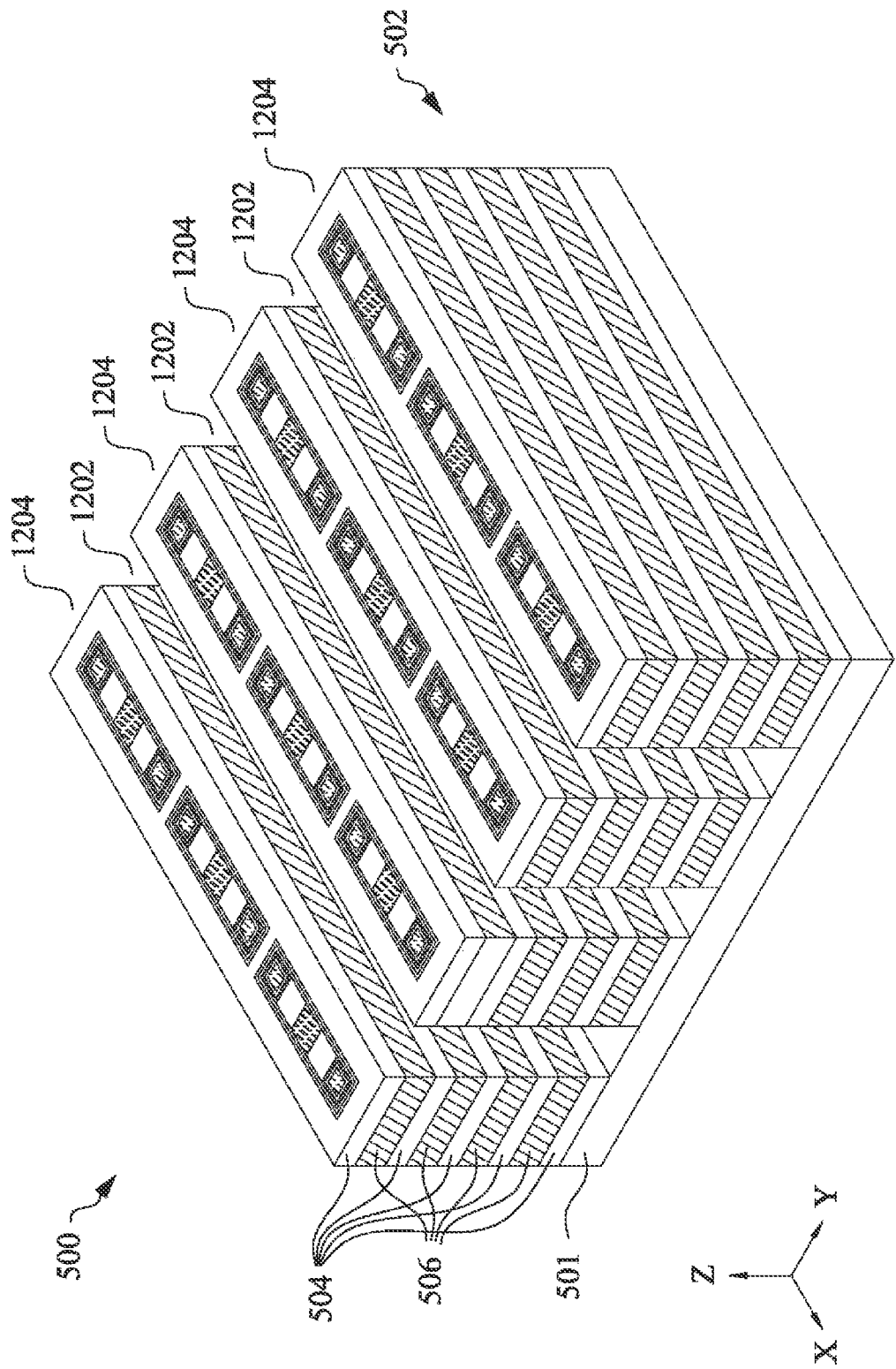

Corresponding to operation 416 of FIG. 4, FIG. 12 illustrates a perspective view of the 3D memory device 500 in which the stack 502 is patterned at one of the various stages of fabrication, in accordance with various embodiments.

The stack 502 is patterned to form a number of trenches 1202 extending along a same lateral direction (e.g., the X direction). In various embodiments, each of the trenches 1202 is formed to cut or otherwise pattern the stack 502 into a number of stripes 1204 by, for example, an etching process. Each of the stripes 1204 includes respective patterned portions of the insulating layers 504 and sacrificial layers 506 wrapping around a number of vertical recesses (e.g., 602A to 602C in the example of FIG. 12) that are each filled with a pair of MFM structures 1102 and 1104, a SL 906, a dielectric layer 702, a semiconductor layer 704, and an insulating material 706. With the trenches 1202 formed, at least two sidewalls of each of the patterned sacrificial layers 506 are exposed, allowing the patterned sacrificial layers 506 to be replaced by a number of WLs, which will be described as follows.

Figure 13:
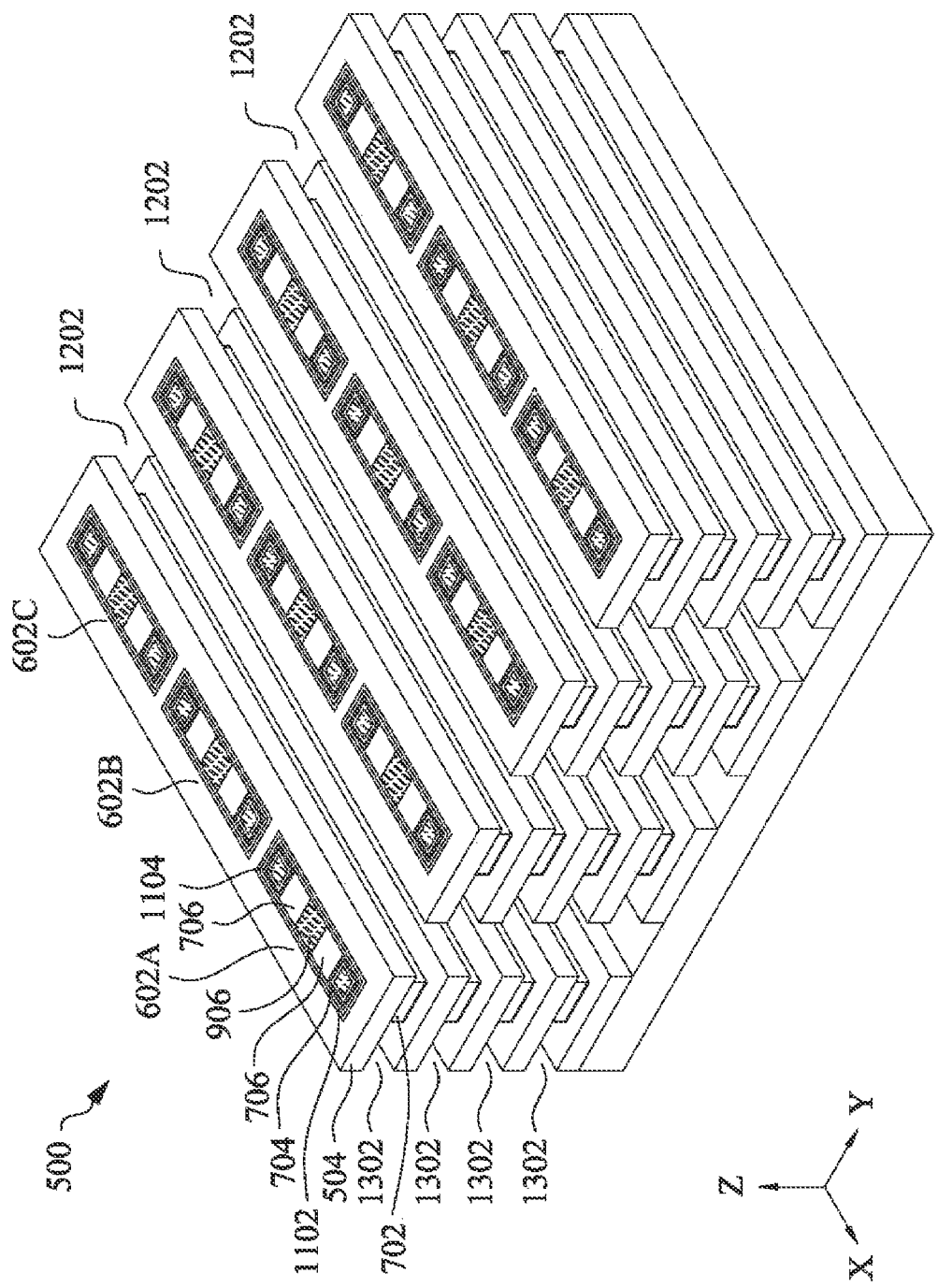

Corresponding to operation 418 of FIG. 4, FIG. 13 illustrates a perspective view of the 3D memory device 500 in which the (patterned) sacrificial layers 506 (FIG. 12) are removed at one of the various stages of fabrication, in accordance with various embodiments.

As shown, the sacrificial layers 506 are removed to form a number of WL recesses 1302. The WL recesses 1302 can expose sidewalls of the dielectric layer 702 as a number of discrete segments arranged along a vertical direction (e.g., the Z direction). In various embodiments of the present disclosure, each of the WL recesses 1302 is disposed at a respective (memory) tier or level and wraps around a number of vertical recesses (e.g., 602A to 602C in the example of FIG. 13) that are each filled with a pair of MFM structures 1102 and 1104, a SL 906, a dielectric layer 702, a semiconductor layer 704, and an insulating material 706. The sacrificial layers 506 can be removed by performing an etching process that etches the sacrificial layers 506 selective to the insulating layers 504 through the trenches 1202. Alternatively stated, the insulating layers 504 may remain substantially intact throughout the etching process. As such, the trenches 1202 (after this etching process) can each include its sidewalls present in a step-like profile that protrudes into spaces each disposed between neighboring ones of the insulating layers 504.

The etching process can include a wet etching process employing a wet etch solution, or can be a gas phase (dry) etching process in which the etchant is introduced in a vapor phase into the trenches 1202. In the example where the sacrificial layers 506 include silicon nitride and the insulating layers 504 include silicon oxide, the etching process can include a wet etching process in which the workpiece is immersed within a wet etch tank that includes phosphoric acid, which etches silicon nitride of the sacrificial layer 506 selective to silicon oxide, silicon, and various other materials of the insulating layers 504. It should be understood that other methods of etching the sacrificial layer 506 are within the scope of the present disclosure.

Figure 14:
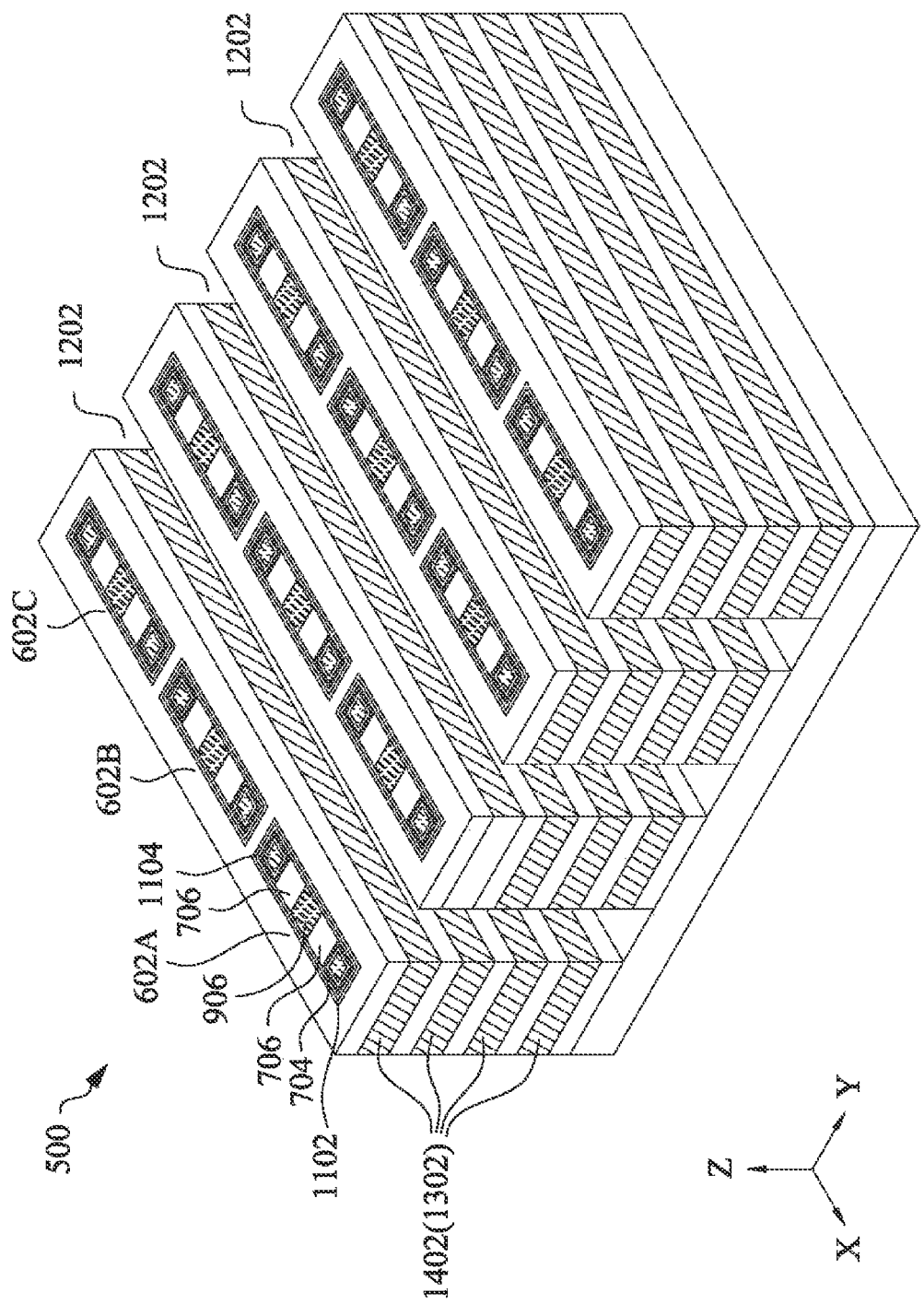

Corresponding to operation 420 of FIG. 4, FIG. 14 illustrates a perspective view of the 3D memory device 500 including a number of WLs 1402 at one of the various stages of fabrication, in accordance with various embodiments.

The WLs 1402 are formed by filling the WL recesses 1302, respectively, with a conductor material (e.g., metal), optionally followed by a polishing process. Example metal materials may be selected from the group including aluminum, tungsten, tungsten nitride, copper, cobalt, silver, gold, chrome, ruthenium, platinum, titanium, titanium nitride, tantalum, tantalum nitride, nickel, hafnium, and combinations thereof. As such, the WLs 1402 can inherit the dimensions and profiles of the WL recesses 1302. That is, each of the WLs 1402 is disposed at a respective (memory) tier or level and wraps around a number of vertical recesses (e.g., 602A to 602C in the example of FIG. 14) that are each filled with a pair of MFM structures 1102 and 1104, a SL 906, a dielectric layer 702, a semiconductor layer 704, and an insulating material 706.

Figure 15:
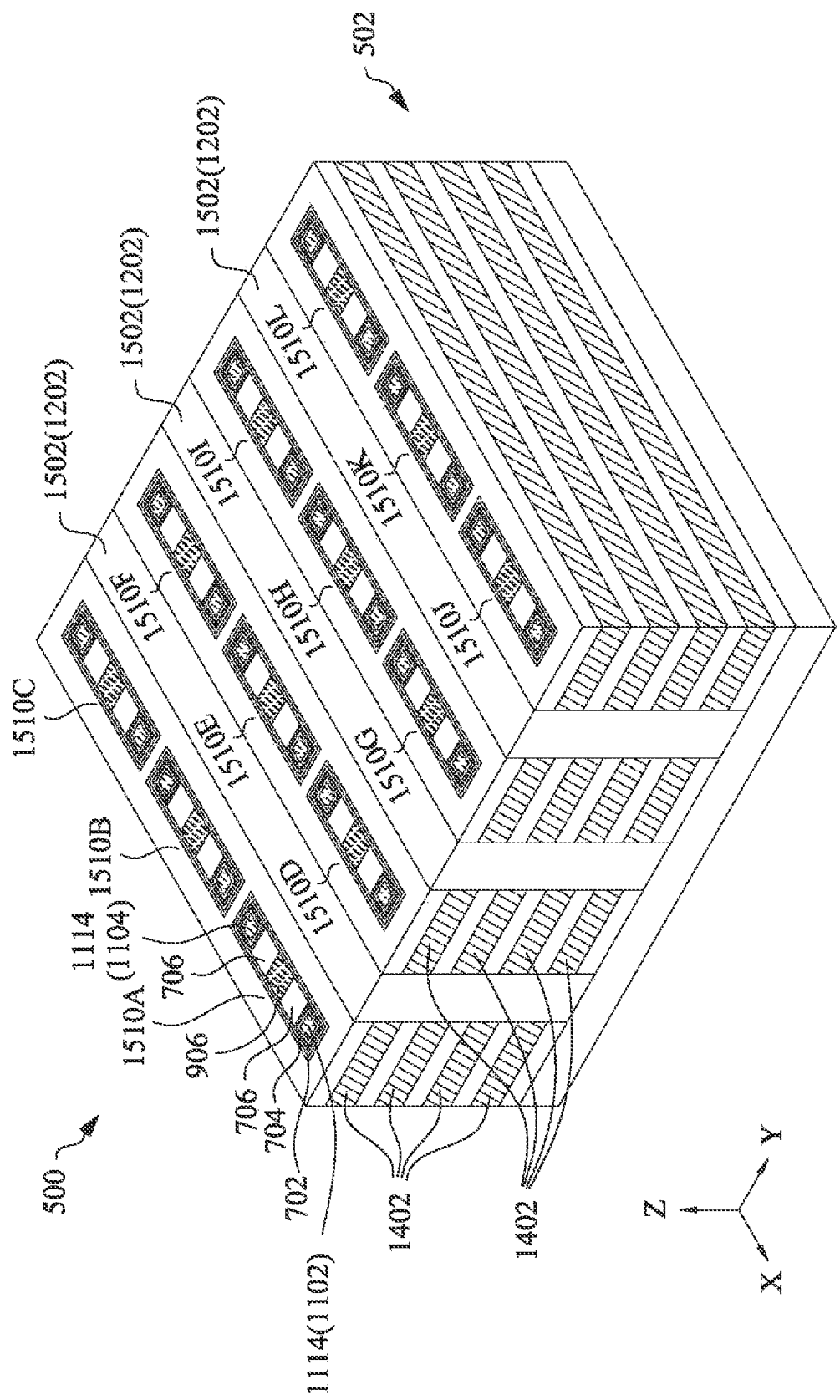

Corresponding to operation 422 of FIG. 4, FIG. 15 illustrates a perspective view of the 3D memory device 500 including an insulating material 1502 filling each of the trenches 1202 at one of the various stages of fabrication, in accordance with various embodiments. Upon forming the WLs 1402, the trenches 1202 are filled with the insulating material 1502 so as to (e.g., electrically) isolate neighboring subsets of the WLs 1402 disposed along the Y direction. In some embodiments, the insulating material 1502 may be similar to the material of the insulating layers 504.

Following the formation of the insulating material 1502 (or the isolation of the WLs 1402), a number of memory string pairs (similar to 100 of FIG. 1) can be formed or defined across the stack 502. For example in FIG. 15, memory string pairs, 1510A, 1510B, 1510C, 1510D, 1510E, 1510F, 1510G, 1510H, 1510I, 1510J, 1510K, 1510L, can be defined. The memory string pairs 1510A to 1510L can form an array, e.g., having a subset of the memory string pairs arranged in a corresponding one of a number of rows with the memory string pairs in each subset arranged along respective columns. Each of the memory string pairs 1510A to 1510L is substantially similar to the memory string 100 of FIG. 1, and thus, the memory string pair 1510A is selected as a representative example to be briefly described as follows.

The memory string pair 1510A has a first memory string and a second memory string. The first memory string has a number of memory cells, which are defined by the WLs 1402, the dielectric layer 702, the semiconductor layer 704, the SL 906, and the inner structure 1114 of the MFM structure 1102 that functions as their BL. The second memory string also has a number of memory cells, which are defined by the same WLs 1402, the same dielectric layer 702, and the same semiconductor layer 704, the same SL 906, but by the inner structure 1114 of the MFM structure 1104 that functions as their BL. The memory cells of each of the first and second memory strings are arranged on top of one another along the Z direction, each of which is gated by a corresponding one of the WLs 1401 that are disposed in respective different memory levels (or tiers). There are four of such memory levels in the example of FIG. 15.

Figure 16:
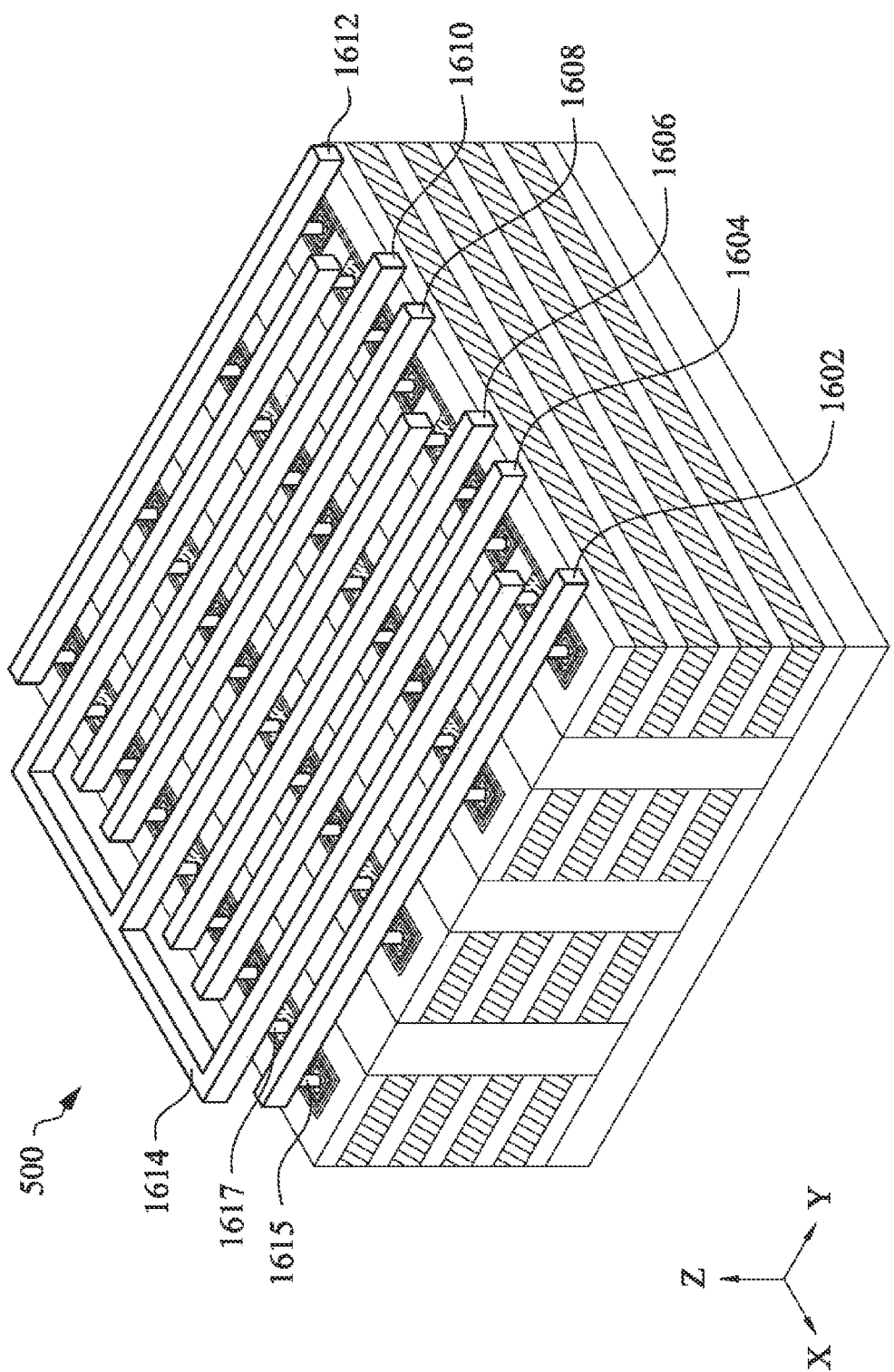

Corresponding to operation 424 of FIG. 4, FIG. 16 illustrates a perspective view of the 3D memory device 500 including a number of interconnect structures (or metal routings) 1602, 1604, 1606, 1608, 1610, 1612, and 1614 at one of the various stages of fabrication, in accordance with various embodiments.

The interconnect structures 1602 to 1612 are formed to extend along a same lateral direction (e.g., the Y direction). Specifically, each of the interconnect structures 1602 to 1612 is configured to operatively (e.g., electrically) coupled to a corresponding number of BLs 1114 of the 3D memory device 500 that are arranged along a line in the Y direction through respective via structures (e.g., vias 1615). The interconnect structure 1614 is formed to connect all the SLs 906 of the 3D memory device 500 to each other through respective via structures (e.g., vias 1617). As such, the interconnect structure 1614 may have at least a first portion extending along the same lateral direction of the interconnect structures 1602 to 1612 (e.g., the Y direction), and a second portion extending along another lateral direction (e.g., the X direction).

Figure 17:
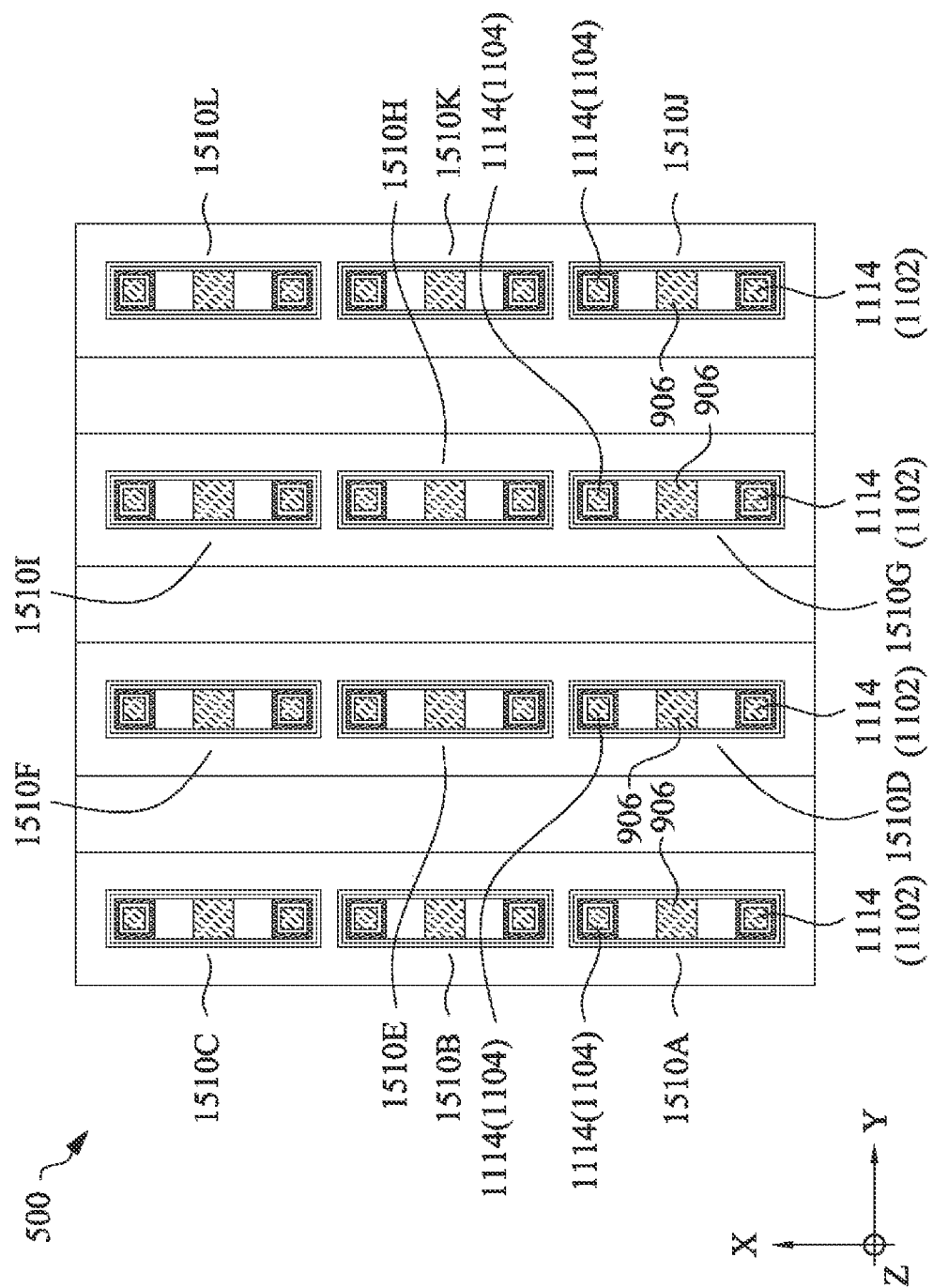
FIGS. 17, 18, 19, 20, and 21 illustrate top views of the example 3D memory device shown in FIGS. 5 to 16, in accordance with some embodiments.
Figure 18:
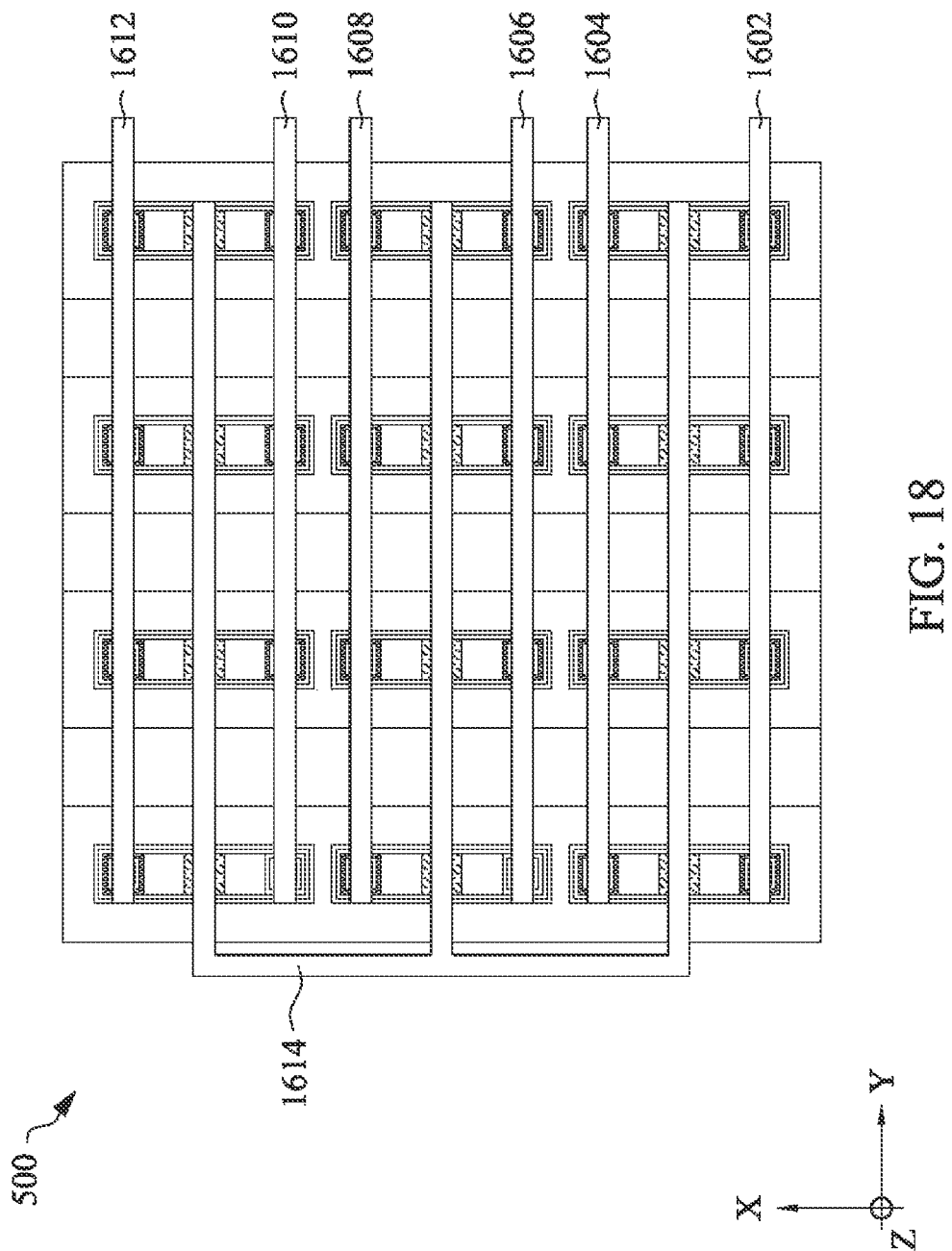

To better illustrate the connections of the interconnect structures 1602-1614 to their respective BLs or SLs, top views of the 3D memory device 500 with the interconnect structures 1602-1614 and without the interconnect structures 1602-1614 are illustrated in FIGS. 17 and 18, respectively. As shown in FIG. 17, the memory string pairs 1510A to 1510L are arranged as an array. Specifically, the memory string pairs 1510A, 1510D, 1510G, and 1510J are arranged along a first row, each of which is arranged along a respective one of first to fourth columns; the memory string pairs 1510B, 1510E, 1510H, and 1510K are arranged along a second row, each of which is arranged along a respective one of first to fourth columns; and the memory string pairs 1510C, 1510F, 1510I, and 1510L are arranged along a third row, each of which is arranged along a respective one of first to fourth columns. Referring next to FIG. 18, the interconnect structure 1602 is coupled to the BLs 1114 wrapped within one of the two MFM structures 1102 of the memory string pairs disposed along the first row, e.g., 1510A, 1510D, 1510G, and 1510J; the interconnect structure 1604 is coupled to the BLs 1114 wrapped within the other one of the two MFM structures 1104 of the memory string pairs disposed along the first row, e.g., 1510A, 1510D, 1510G, and 1510J; and so on. The interconnect structure 1614 is coupled to the SLs 906 of the memory string pairs 1510A to 1510L across the whole array.

Figure 19:
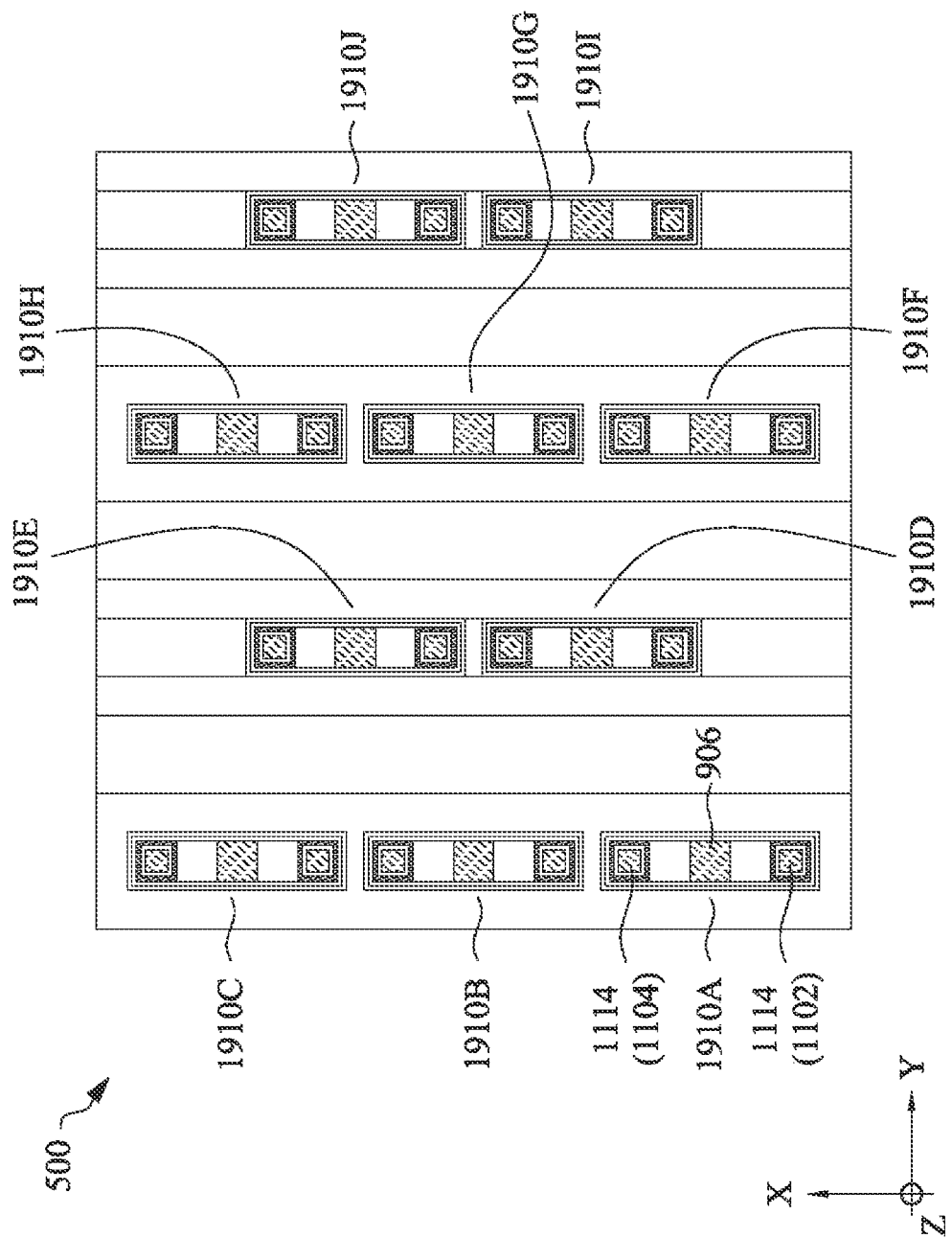
Figure 20:
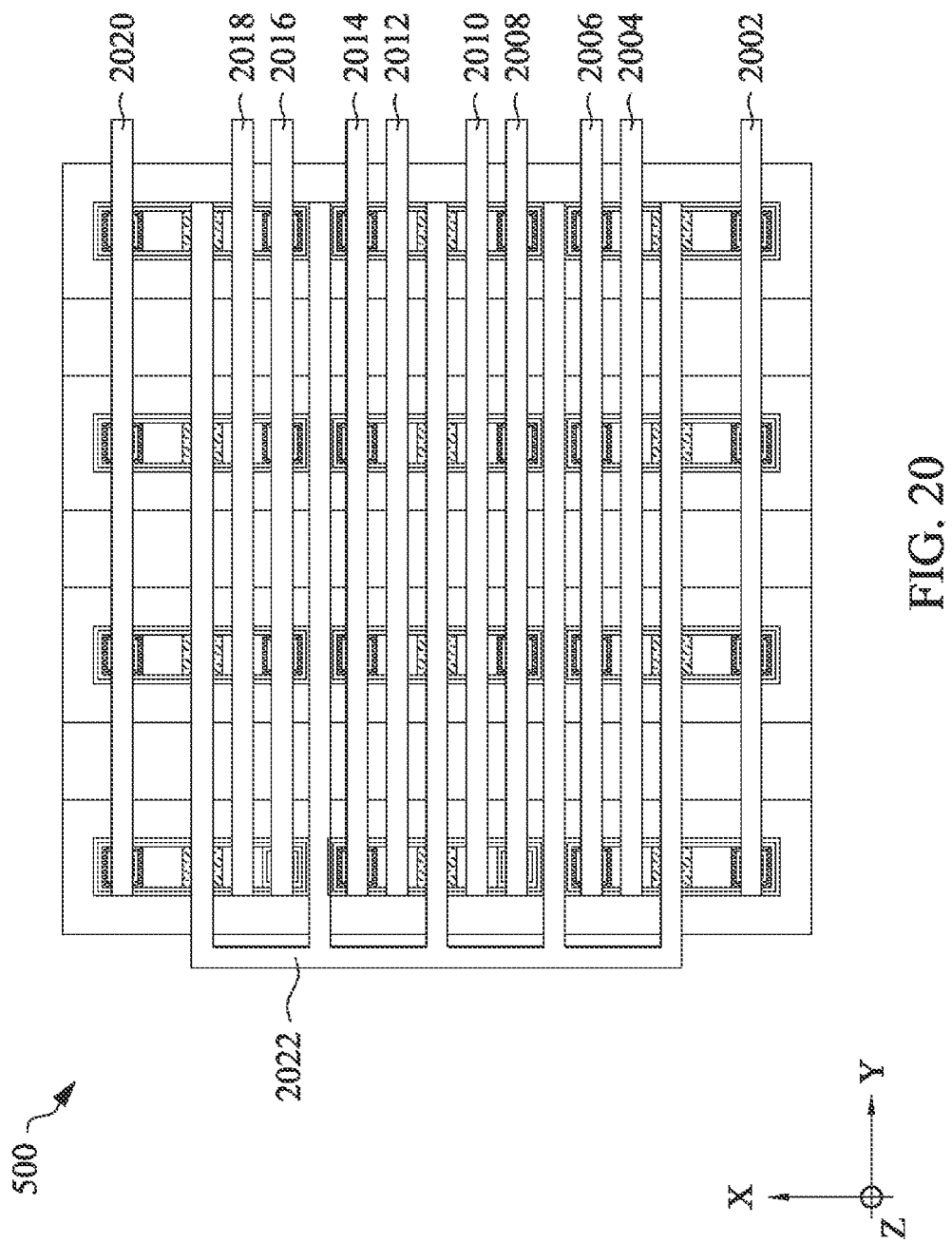
Figure 21:
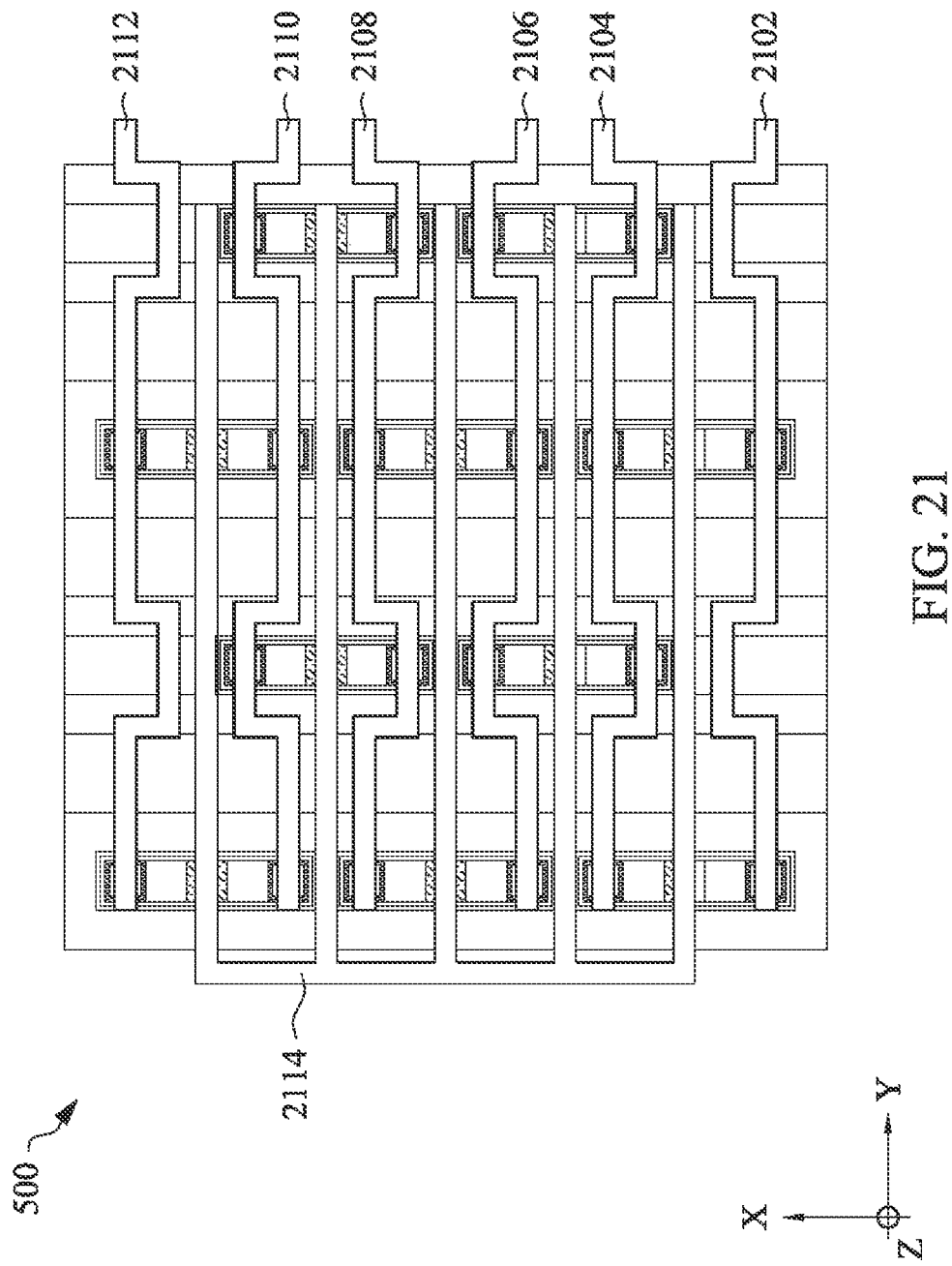

FIG. 19 illustrates a top view of the 3D memory device 500 including a number of memory string pairs 1910A, 1910B, 1910C, 1910D, 1910E, 1910F, 1910G, 1910H, 1910I, and 1910J arranged as another array. FIGS. 20 and 21 respectively illustrate tops view of the 3D memory device including a number of interconnect structures formed according to the arrangements of the memory string pairs 1910A to 1910J shown in FIG. 19. It should be noted that each of the memory strings 1910A to 1910J is substantially similar to the memory string pair discussed above, and thus, the description is not repeated.

Referring first to FIG. 19, the memory string pairs 1910A to 1910C are arranged along a first column; the memory string pairs 1910D to 1910E are arranged along a second column; the memory string pairs 1910F to 1910H are arranged along a third column; and the memory string pairs 1910I to 1910J are arranged along a fourth column. Further, the memory string pair in each column is aligned with the memory string pair in the next neighboring column. For example, the memory string pair 1910A in the first column is aligned with the memory string pair 1910F in the third column (instead of the memory string pair 1910D in the second column). Similarly, the memory string pair 1910D in the second column is aligned with the memory string pair 1910I in the fourth column (instead of the memory string pair 1910F in the third column). Such an arrangement is sometimes referred to as a staggered array.

To couple the BLs 1114 and SLs 906 configured in such a staggered array (e.g., FIG. 19), the 3D memory device 500 may include interconnect structures 2002, 2004, 2006, 2008, 2010, 2012, 2014, 2016, 2018, and 2020, as shown in FIG. 20; or interconnect structures 2102, 2104, 2106, 2108, 2110, 2112, and 2114, as shown in FIG. 21.

For example in FIG. 20, the interconnect structure 2002 is coupled to the BLs 1114 wrapped within the two MFM structures 1102 of the memory string pairs disposed along the first column and third column, e.g., 1910A and 1910F; the interconnect structure 2004 is coupled to the BLs 1114 wrapped within the two MFM structures 1102 of the memory string pairs disposed along the second column and fourth column, e.g., 1910D and 1910I; the interconnect structure 2006 is coupled to the BLs 1114 wrapped within the two MFM structures 1104 of the memory string pairs disposed along the first column and third column, e.g., 1910A and 1910F; the interconnect structure 2010 is coupled to the BLs 1114 wrapped within the two MFM structures 1102 of the memory string pairs disposed along the second column and fourth column, e.g., 1910D and 1910I; and so on. The interconnect structure 2022 is coupled to the SLs 906 of the memory string pairs 1910A to 1910J across the whole array.

In FIG. 21, each of the interconnect structures 2102 to 2112 has a number of pulses in order to couple to the BLs 1114 disposed across all the columns. Using the interconnect structure 2104 as a representative example, in addition to coupling to the BLs 1114 wrapped within the two MFM structures 1104 of the memory string pairs disposed along the first column and third column, e.g., 1910A and 1910F, the interconnect structure 2104 is coupled to the BLs 1114 wrapped within the two MFM structures 1102 of the memory string pairs disposed along the second column and fourth column, e.g., 1910D and 1910I. Specifically, the interconnect structure 2104 has a number of pulses to couple to the BLs 1114 disposed in the second and fourth columns, and no pulses across the BLs 114 disposed in the first and third columns.

Referring to FIGS. 22, 23, 24, and 25, cross-sectional views of one of the disclosed memory string pairs cut along a plane of the X direction and Y direction are illustrated, in various embodiments. Further, the cross-sectional views of FIGS. 22-25 may be cut across one of multiple coupled WLs 1402. It should be understood that the cross-sectional views of FIGS. 22-25 are simplified, and thus, some of the components discussed above (e.g., other memory string pairs coupled to the same WL) are not shown.

In the memory string pair of FIG. 22, the MFM structures 1102 and 1104 including the BLs 1114 are disposed on two sides of the SL 906, each with the insulating material 706 interposed therebetween. A sidewall of any of the MFM structure 1102 or 1104, facing either toward or way from the X direction, is in contact with the insulating material 706 and has both ends directly contacting the semiconductor layer 704.

In FIG. 23, the memory string pair includes a number of dielectric films 2302. Each dielectric film 2302 is disposed opposite the semiconductor layer 704 from the dielectric layer 702. The dielectric film 2302 can include a similar dielectric material as the dielectric layer 702 (e.g., a high-k dielectric material). With such a dielectric film disposed opposite to the dielectric layer 702 that functions as the gate dielectric of a corresponding transistor, an effective channel length of the transistor can be modulated according to a length (extending along the X direction) of the dielectric film 2402. Further, the dielectric film 2302 can extend beyond sidewalls of the MFM structures 1102 and 1104 and the SL 906 along the X direction, respectively. The sidewall of any of the MFM structure 1102 or 1104 and the sidewall of the SL 906 face each other, e.g., either toward or way from the X direction.

In FIG. 24, the memory string pair includes a number of dielectric films 2402. Each dielectric film 2402 is disposed opposite the semiconductor layer 704 from the dielectric layer 702. The dielectric film 2402 can include a similar dielectric material as the dielectric layer 702 (e.g., a high-k dielectric material). With such a dielectric film disposed opposite to the dielectric layer 702 that functions as the gate dielectric of a corresponding transistor, an effective channel length of the transistor can be modulated according to a length (extending along the X direction) of the dielectric film 2402. Further, the dielectric film 2402 can extend beyond sidewalls of the MFM structures 1102 and 1104 along the X direction, respectively. The sidewalls of the MFM structure 1102 and 1104 face each other, e.g., either toward or way from the X direction.

In FIG. 25, the memory string pair includes a number of dielectric films 2502. Each dielectric film 2502 is disposed opposite the semiconductor layer 704 from the dielectric layer 702. The dielectric film 2502 can include a similar dielectric material as the dielectric layer 702 (e.g., a high-k dielectric material). With such a dielectric film disposed opposite to the dielectric layer 702 that functions as the gate dielectric of a corresponding transistor, an effective channel length of the transistor can be modulated according to a length (extending along the X direction) of the dielectric film 2502. Further, the dielectric film 2502 can extend beyond sidewalls of the SL 906 along the X direction, respectively. The sidewalls of the SL 906 face away from each other, e.g., either toward or way from the X direction.

In one aspect of the present disclosure, a semiconductor device is disclosed. The semiconductor device includes a first concentric structure extending along a vertical direction and wrapping around a first conductor structure. The semiconductor device includes a second concentric structure extending along the vertical direction and wrapping around a second conductor structure. The semiconductor device includes a third conductor structure extending along the vertical direction, wherein the third conductor structure is interposed between and spaced from the first and second concentric structures along a first lateral direction. The semiconductor device includes a fourth conductor structure extending along the first lateral direction. The fourth conductor structure at least partially wraps around each of the first concentric structure, the third conductor structure, and the second concentric structure.

In another aspect of the present disclosure, a memory device is disclosed. The memory device includes a memory array comprising a plurality of memory strings spaced from one another along a lateral direction. A first one of the plurality of memory strings comprises a plurality of first memory cells arranged along a vertical direction, and a second one of the plurality of memory strings comprises a plurality of second memory cells arranged along the vertical direction. The plurality of first memory cells share a first bit line wrapped within a first concentric structure and share a common source line. The plurality of second memory cells share a second bit line wrapped within a second concentric structure and share the common source line.

In yet another aspect of the present disclosure, a method for fabricating memory devices is disclosed. The method includes forming a recess extending through a stack, wherein the stack includes a plurality of insulating layers and a plurality of sacrificial layers alternately arranged along a vertical direction. The method includes sequentially lining inner sidewalls of the vertical recess with a dielectric layer and then a semiconductor layer. The method includes forming a first conductor structure at a middle position of the recess, wherein the first conductor structure extends along the vertical direction. The method includes forming a first concentric structure and a second concentric structure at end positions of the recess, respectively, wherein the first and second concentric structures each extend along the vertical direction.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first concentric structure extending along a vertical direction and wrapping around a first conductor structure;
    a second concentric structure extending along the vertical direction and wrapping around a second conductor structure;
    a third conductor structure extending along the vertical direction, wherein the third conductor structure is interposed between and spaced from the first and second concentric structures along a first lateral direction; and
    a fourth conductor structure extending along the first lateral direction;
    wherein the fourth conductor structure at least partially wraps around each of the first concentric structure, the third conductor structure, and the second concentric structure.

2. The semiconductor device of claim 1, further comprising:
    a high-k dielectric layer extending along the vertical direction and at least partially wrapping around each of the first concentric structure, the third conductor structure, and the second concentric structure; and
    a semiconductor layer extending along the vertical direction and at least partially wrapping around each of the first concentric structure, the third conductor structure, and the second concentric structure.

3. The semiconductor device of claim 2, wherein the fourth conductor structure wraps around the high-k dielectric layer, and the high-k dielectric layer wraps around the semiconductor layer.

4. The semiconductor device of claim 1, wherein the first concentric structure further comprises:
a first ferroelectric layer extending along the vertical direction and wrapping around the first conductor structure; and
a fifth conductor structure extending along the vertical direction and wrapping around the first ferroelectric layer.

5. The semiconductor device of claim 4, wherein the second concentric structure further comprises:
a second ferroelectric layer extending along the vertical direction and wrapping around the second conductor structure; and
a sixth conductor structure extending along the vertical direction and wrapping around the second ferroelectric layer.

6. The semiconductor device of claim 1, wherein the fourth conductor structure is coupled to three sidewalls of the first concentric structure, and to three sidewalls of the second concentric structure.

7. The semiconductor device of claim 6, wherein the fourth conductor structure is coupled to two sidewalls of the third conductor structure.

8. The semiconductor device of claim 7, wherein the third conductor structure has two other sidewalls facing a sidewall of the first concentric structure other than the three sidewalls of the first concentric structure and a sidewall of the second concentric structure other than the three sidewalls of the second concentric structure, respectively.

9. The semiconductor device of claim 1, further comprising a plurality of the fourth conductor structures spaced apart from one another along the vertical direction.

10. The semiconductor device of claim 1, wherein the first concentric structure functions as a first capacitor of a first memory cell, with the first conductor structure functions as a first bit line coupled to the first memory cell, wherein the second concentric structure functions as a second capacitor of a second memory cell, with the second conductor structure functions as a second bit line coupled to the second memory cell, and wherein the third conductor structure functions as a common source line coupled to the first and second memory cells.

11. A memory device, comprising:
a memory array comprising a plurality of memory strings spaced from one another along a lateral direction,
wherein a first one of the plurality of memory strings comprises a plurality of first memory cells arranged along a vertical direction, and a second one of the plurality of memory strings comprises a plurality of second memory cells arranged along the vertical direction,
wherein the plurality of first memory cells share a first bit line wrapped within a first concentric structure and share a common source line,
wherein the plurality of second memory cells share a second bit line wrapped within a second concentric structure and share the common source line, and
wherein the first concentric structure, the second concentric structure, and the common source line are wrapped within a semiconductor layer that continuously extends along the vertical direction.

12. The memory device of claim 11, wherein the first concentric structure further comprises:
a first ferroelectric layer wrapping around the first bit line; and
a first metal structure wrapping around the first ferroelectric layer.

13. The memory device of claim 12, wherein the second concentric structure further comprises:
a second ferroelectric layer wrapping around the second bit line; and
a second metal structure wrapping around the second ferroelectric layer.

14. The memory device of claim 11, wherein each of the plurality of first memory cells and a corresponding one of the plurality of second memory cells share one of a plurality of word lines.

15. The memory device of claim 14, wherein each of the plurality of word lines wraps around the semiconductor layer.

16. The memory device of claim 14, wherein each of the plurality of word lines wraps around a high-k dielectric layer continuously extending along the vertical direction, and the high-k dielectric layer wraps around a semiconductor layer continuously extending along the vertical direction.

17. The memory device of claim 11, wherein the first concentric structure functions as a plurality of first capacitors of the plurality of first memory cells, respectively, and the second concentric structure functions as a plurality of second capacitors of the plurality of second memory cells, respectively.

18. A semiconductor device, comprising:
a first concentric structure extending along a vertical direction over a semiconductor substrate;
a first bit line wrapped within the first concentric structure;
a second concentric structure extending along the vertical direction over the semiconductor substrate and separated from the first concentric structure along a lateral direction;
a second bit line wrapped within the second concentric structure;
a source line extending along the vertical direction and interposed between the first concentric structure and the second concentric structure along the lateral direction;
a semiconductor layer extending along the vertical direction and wrapping around the first concentric structure, the second concentric structure, and the source line; and
a word line extending along the vertical direction and wrapping around the semiconductor layer.

19. The semiconductor device of claim 18, wherein the first concentric structure includes a first ferroelectric structure such that the first bit line is wrapped within the first ferroelectric structure, and wherein the second concentric structure includes a second ferroelectric structure such that the second bit line is wrapped within the second ferroelectric structure.

20. The semiconductor device of claim 18, further comprising a dielectric layer extending along the vertical direction and disposed between the semiconductor layer and the word line.

* * * * *